United States Patent
Shibayama et al.

(10) Patent No.: US 12,227,621 B2
(45) Date of Patent: Feb. 18, 2025

(54) FILM-FORMING COMPOSITION

(71) Applicant: NISSAN CHEMICAL CORPORATION, Tokyo (JP)

(72) Inventors: Wataru Shibayama, Toyama (JP); Yuichi Goto, Toyama (JP); Shun Kubodera, Toyama (JP); Satoshi Takeda, Toyama (JP); Ken Ishibashi, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 891 days.

(21) Appl. No.: 17/288,665

(22) PCT Filed: Oct. 25, 2019

(86) PCT No.: PCT/JP2019/042036
§ 371 (c)(1),
(2) Date: Apr. 26, 2021

(87) PCT Pub. No.: WO2020/085508
PCT Pub. Date: Apr. 30, 2020

(65) Prior Publication Data
US 2021/0395462 A1    Dec. 23, 2021

(30) Foreign Application Priority Data
Oct. 26, 2018    (JP) ................. 2018-202238

(51) Int. Cl.
*H01L 21/027*    (2006.01)
*C08G 77/26*    (2006.01)
*H01L 21/308*    (2006.01)

(52) U.S. Cl.
CPC .......... *C08G 77/26* (2013.01); *H01L 21/0274* (2013.01); *H01L 21/3081* (2013.01); *H01L 21/3086* (2013.01)

(58) Field of Classification Search
CPC .................................................. C08G 77/26
See application file for complete search history.

(56) References Cited

U.S. PATENT DOCUMENTS

| | | | |
|---|---|---|---|
| 2014/0356792 A1* | 12/2014 | Noya ............... | H01L 21/3081 106/287.18 |
| 2017/0322491 A1* | 11/2017 | Shibayama .......... | G03F 7/40 |
| 2018/0149977 A1* | 5/2018 | Shibayama .......... | C09D 183/04 |

FOREIGN PATENT DOCUMENTS

| | | |
|---|---|---|
| WO | 2010/021290 A1 | 2/2010 |
| WO | 2010/071155 A1 | 6/2010 |
| WO | 2011/102470 A1 | 8/2011 |
| WO | 2014/046055 A1 | 3/2014 |
| WO | 2016/190261 A1 | 12/2016 |

OTHER PUBLICATIONS

Dec. 16, 2021 Office Action issued in Chinese Patent Application No. 201980085619.8.
Feb. 4, 2023 Office Action issued in Taiwanese Patent Application No. 108138617.
Dec. 17, 2019 International Search Report issued in International patent Application No. PCT/JP2019/042036.
Dec. 17, 2019 Written Opinion issued in International patent Application No. PCT/JP2019/042036.
Aug. 1, 2022 Office Action issued in Chinese Patent Application No. 201980085619.8.
Aug. 10, 2022 Notice of Refusal for Japanese Patent Application No. 2020-552637.
Jan. 10, 2024 Office Action issued in Korean Patent Application No. 10-2021-7013009.

* cited by examiner

*Primary Examiner* — Walter H Swanson
(74) *Attorney, Agent, or Firm* — Oliff PLC

(57) ABSTRACT

A film-forming composition suitable as a resist underlayer film-forming composition from which a resist underlayer film having not only a good EUV resist adhesivity but also a good etching processability due to a high fluorine-based etching rate.

For example, a film-forming composition includes a polymer represented by Formula (E1) and a solvent.

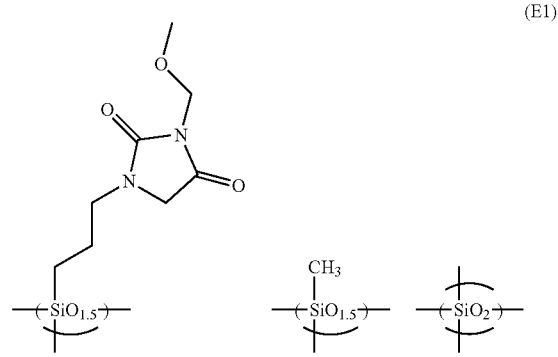

(E1)

14 Claims, No Drawings

FILM-FORMING COMPOSITION

TECHNICAL FIELD

The present invention relates to a film-forming composition.

BACKGROUND ART

Conventionally, fine processing by lithography with photoresists has been carried out in producing semiconductor devices. The fine processing is a processing method in which a thin film of a photoresist is formed on a semiconductor substrate such as a silicon wafer, active rays such as ultraviolet rays are radiated onto the thin film via a mask pattern on which a pattern of a semiconductor device is drawn, development of the irradiated thin film is carried out, and the substrate is etched, using a photoresist pattern thus obtained as a protective film, so as to form fine convexes and concaves on the surface of the substrate corresponding to the pattern.

Recently, resist films have become remarkably thinner in most-advanced semiconductor devices. Especially, in a tri-layer process including a resist layer, a silicon-containing resist underlayer film, and an organic underlayer film, not only a lithographic property of a resist on the silicon-containing resist underlayer film, but also a high etching rate has become required. Especially, Extreme Ultraviolet (EUV) lithography has such a serious problem that, for a better lithographic property, introduction of a large amount of a functional group having a high adhesivity with the resist and addition of a large amount of a photoacid generator for a better resolution are inevitable while a greater amount of organic composition associated with the introduction of such a large amount of the functional group and the addition of such a large amount of the photoacid generator, results in a slower etching rate.

Under such circumstances, a resist underlayer film-forming composition including a silane compound having an onium group and a resist underlayer film including a silane compound having an anion group have been reported (Patent Documents 1 and 2).

However, recently, resist films have become remarkably finer in most-advanced semiconductor devices. Among them, in the tri-layer process, Si-HM of the resist underlayer film is required to have not only an excellent lithographic property, but also a high etching rate. Especially for EUV generations, a large amount of a functional group having a high adhesivity with a resist should be introduced for the sake of improvement of the lithographic property (especially prevention of pattern collapse).

PRIOR ART DOCUMENTS

Patent Documents

Patent Document 1: International Publication Pamphlet No. 2010-021290
Patent Document 2: International Publication Pamphlet No. 2010-071155

SUMMARY OF THE INVENTION

Problems to be Solved by the Invention

The present invention was accomplished in view of the aforementioned circumstances, and an object of the present invention is to provide a film-forming composition suitable as a resist underlayer film-forming composition, from which a resist underlayer film not only having a good EUV resist adhesivity but also having a good etching processability due to a high fluorine-based etching rate can be produced.

Means for Solving the Problems

As a result of diligent studies for achieving the object, the present inventors found that a composition including at least one kind selected from a hydrolyzable silane, a hydrolysis product thereof, and a hydrolysis condensate thereof, and a solvent, the hydrolyzable silane having a predetermined organic group containing an amide group or an amino group having a hydroxy alkyl group or an alkoxy alkyl group on a nitrogen atom thereof, can provide a thin film suitable as a resist underlayer film because the thin film shows a good EUV resist adhesivity and further has a good etching processability due to a high fluorine-based etching rate, thereby accomplishing the present invention.

According to the present invention, there are provided:

1. A film-forming composition, including at least one kind selected from a hydrolyzable silane, a hydrolysis product thereof, and a hydrolysis condensate thereof, and a solvent,
the hydrolyzable silane including a crosslinkable group-containing silane represented by Formula (1):

$$R^1R^2_aSi(R^3)_{3-a} \qquad (1)$$

(wherein, in Formula (1), $R^1$ is a group bonding to a silicon atom, and independently represents an organic group containing an amide group or an amino group having a hydroxy alkyl group or an alkoxy alkyl group on a nitrogen atom thereof, $R^2$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^3$ is a group or an atom bonding to a silicon atom, and independently represents an alkoxy group, an aralkyloxy group, an acyloxy group, or a halogen atom, and a is an integer of 0 to 2), 2. The film-forming composition according to 1, wherein the organic group containing the amide group or the amino group having the hydroxy alkyl group or the alkoxy alkyl group on a nitrogen atom thereof is a group represented by any one of the following formulae (A1) to (A10):

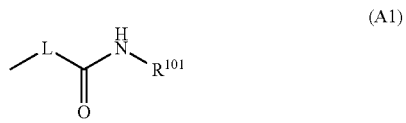

-continued

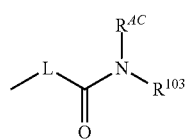
(A3)

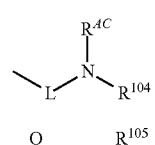
(A4)

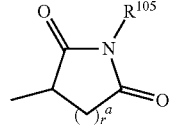
(A5)

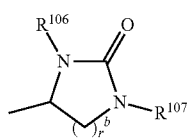
(A6)

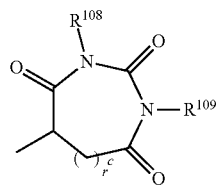
(A7)

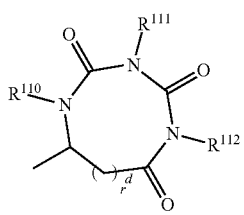
(A8)

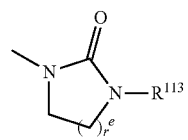
(A9)

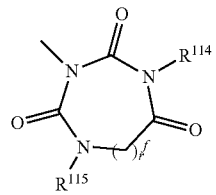
(A10)

(wherein, in Formulae (A1) to (A10),
each of $R^{101}$ to $R^{115}$ independently represents a hydroxy alkyl group or an alkoxy alkyl group,
each of L independently represents an alkylene group,
each of $R^{AC}$ independently represents an alkyl carbonyl group, and
each of $r^a$ to $r^f$ is independently an integer of 0 to 4), 3. The film-forming composition according to 1 or 2, including the hydrolysis condensate of the hydrolyzable silane, 4. The film-forming composition according to any one of 1 to 3, wherein the hydrolyzable silane includes the crosslinkable group-containing silane represented by Formula (1), and at least one kind selected from another silane represented by Formula (2) and another silane represented by Formula (3):

$$R^{11}{}_b Si(R^{12})_{4-b} \quad (2)$$

$$[R^{21}{}_c Si(R^{22})_{3-c}]_2 Y \quad (3)$$

(wherein, in Formula (2), $R^{11}$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^{12}$ is a group or an atom bonding to a silicon atom, and independently represents an alkoxy group, an aralkyloxy group, an acyloxy group, or a halogen atom, b represents an integer of 0 to 3, in Formula (3), $R^{21}$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^{22}$ is a group or an atom bonding to a silicon atom, and independently represents an alkoxy group, an aralkyloxy group, an acyloxy group or a halogen atom, Y is a group bonding to a silicon atom, and independently represents an alkylene group or an arylene group, and c is independently an integer of 0 to 2), 5. The film-forming composition according to 4, wherein the hydrolyzable silane includes the crosslinkable group-containing silane represented by Formula (1) and the other silane represented by Formula (2), 6. The film-forming composition according to any one of 1 to 5, wherein the hydrolyzable silane further includes a hydrolyzable organosilane having an onium group in its molecule, 7. The film-forming composition according to any one of 1 to 6, wherein the solvent includes water, 8. The film-forming composition according to any one of 1 to 7, further including a pH adjuster, 9. The film-forming composition according to any one of 1 to 8, being used for forming a resist underlayer film for use in a lithographic process, 10. A resist underlayer film obtainable from the film-forming composition according to any one of 1 to 9, 11. A substrate for semiconductor processing, including: a semiconductor substrate; and the resist underlayer film according to 10, 12. A method for producing a semiconductor device, the producing method including:

a step of forming, on a semiconductor substrate, a resist underlayer film from the film-forming composition according to any one of 1 to 9;

a step of forming a resist film on the resist underlayer film;

a step of performing light exposure of the resist film;

a step of developing the resist film after the light exposure, and obtaining a resist pattern;

a step of etching the resist underlayer film with the resist pattern; and a step of processing the semiconductor substrate with the patterned resist film and resist underlayer film, 13. A method for producing a semiconductor device, the producing method including:

a step of forming an organic underlayer film on a semiconductor substrate;

a step of forming, on the organic underlayer film, a resist underlayer film from the film-forming composition according to any one of 1 to 9;

a step of forming a resist film on the resist underlayer film;

a step of performing light exposure of the resist film;

a step of developing the resist film after the light exposure, and obtaining a resist pattern;

a step of etching the resist underlayer film with the resist pattern; and a step of processing the semiconductor substrate with the patterned resist film and resist underlayer film, and 14. A crosslinkable group-containing silane, represented by Formula (1):

$$R^1R^2{}_aSi(R^3)_{3-a} \quad (1)$$

[wherein, in Formula (1), $R^1$ is a group bonding to a silicon atom, and independently represents a group represented by any one of the following formulae (A1) to (A10):

(A1)

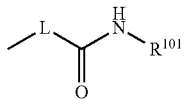

(A2)

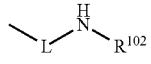

(A3)

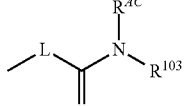

(A4)

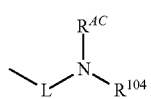

(A5)

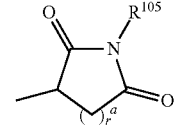

(A6)

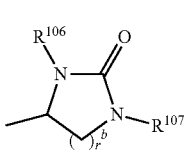

(A7)

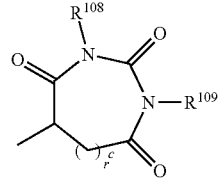

(A8)

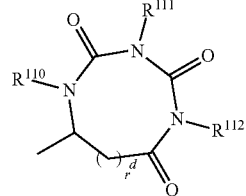

(A9)

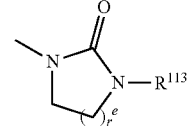

(A10)

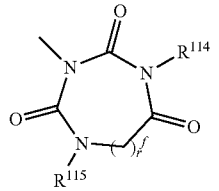

(wherein, in Formulae (A1) to (A10), each of $R^{101}$ to $R^{115}$ independently represents a hydroxy alkyl group or an alkoxy alkyl group, each of L independently represents an alkylene group, each of $R^{AC}$ independently represents an alkyl carbonyl group, and each of $r^a$ to $r^f$ is independently an integer of 0 to 4), $R^2$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^3$ is a group or an atom bonding to a silicon atom, and independently represents an alkoxy group, an aralkyloxy group, an acyloxy group, or a halogen atom, and a is an integer of 0 to 2].

Effects of the Invention

Because the composition of the present invention includes at least one kind selected from a hydrolyzable silane, a hydrolysis product thereof, and a hydrolysis condensate thereof, the hydrolyzable silane having a predetermined organic group containing an amide group or an amino group having a hydroxy alkyl group or an alkoxy alkyl group on a nitrogen atom thereof, and the organic group causes an aminoplast crosslinking reaction with a phenol in an EUV resist, a thin film obtainable from the composition has a good EUV resist adhesivity. Moreover, because the organic group contains nitrogen and oxygen groups in high concentrations, the thin film obtainable from the composition has a good etching processability due to a high fluorine-based etching rate. As a result thereof, the composition of the present invention makes it possible to form a fine resist and exhibit a high transferability to a base substrate.

MODES FOR CARRYING OUT THE INVENTION

In the following, the present invention will be described further in detail.

Note that a solid content in a film-forming composition according to the present invention means a composition other than a solvent contained in the composition.

Moreover, as described later, the film-forming composition according to the present invention contains at least one kind selected from a particular hydrolyzable silane, a hydrolysis product thereof, and a hydrolysis condensate thereof, that is, contains one, two, or three of these. The hydrolysis product and the hydrolysis condensate thereof encompass partial hydrolysis product or partial hydrolysis condensate in which hydrolysis has not been fully completed.

The film-forming composition according to the present invention includes at least one kind selected from a hydrolyzable silane, a hydrolysis product thereof, and a hydrolysis condensate thereof, and a solvent, in which the hydrolyzable silane contains a crosslinkable group-containing silane represented by Formula (1).

(1)

$R^1$ represents a group bonding to a silicon atom, and $R^1$ independently represents an organic group containing an amide group or an amino group having a hydroxy alkyl group or an alkoxy alkyl group on a nitrogen atom thereof.

The organic group is not particularly limited, provided that the organic group should contain an amide group or an amino group having a hydroxy alkyl group or an alkoxy alkyl group on a nitrogen atom thereof. As the concrete examples thereof, groups represented by any of Formulae (A1) to (A10) are exemplified.

Among them, the group represented by Formula (A9) or (A10) is preferable.

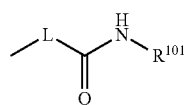
(A1)

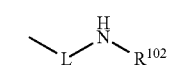
(A2)

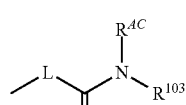
(A3)

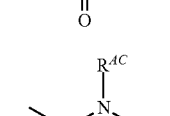
(A4)

(A5)

(A6)

(A7)

(A8)

(A9)

(A10)

Each of $R^{101}$ to $R^{105}$ independently represents a hydroxy alkyl group or an alkoxy alkyl group.

A hydroxy alkyl group is an alkyl group substituted with a hydroxy group, and may be linear, branched, or cyclic.

The number of carbons of the hydroxy alkyl group is not particularly limited, but is preferably $C_{40}$ or less, more preferably $C_{30}$ or less, further preferably $C_{20}$ or less, or still further preferably $C_{10}$ or less.

Specific examples of the linear or branched alkyl group substituted with a hydroxy group are exemplified by methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2- trimethyl-n-propyl group, 1-ethyl-1-methyl-n-propyl group, and 1-ethyl-2-methyl-n-propyl group, but the linear or branched alkyl group substituted with a hydroxy group is not limited to these.

Specific examples of the cyclic alkyl group substituted with a hydroxy group are exemplified by cycloalkyl groups such as cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group; bicycloalkyl groups such as bicyclobutyl group, bicyclopentyl group, bicyclohexyl group, bicycloheptyl group, bicyclooctyl group, bicyclononyl group, and bicyclodecyl group; and the like, but the cyclic alkyl group substituted with a hydroxy group is not limited to these.

Among them, hydroxy-lower alkyl groups such as hydroxy methyl group and 2-hydroxy ethyl group are preferable.

An alkoxy alkyl group is an alkyl group substituted with an alkoxy group, and the alkyl group substituted with an alkoxy group in the alkoxy alkyl group may be linear, branched, or cyclic. Specific examples of the alkyl group are exemplified by the same examples as mentioned above.

The number of carbons of the alkoxy alkyl group is not particularly limited, but is preferably Coo or less, more preferably Cao or less, further preferably Cao or less, or still further preferably Cm or less.

Specific examples of the alkoxy group substituting an alkyl group are exemplified by a chained or branched alkoxy group, such as methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group, and a cyclic alkoxy group, such as cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group, but the alkoxy group substituting an alkyl group is not limited to these.

Among them, the alkoxy group in the alkoxy alkyl group is preferably a lower alkyloxy group such as methoxy group and ethoxy group, while methoxy group is more preferable.

Specific examples of the alkoxy alkyl group are exemplified by lower alkyloxy lower alkyl groups such as methoxy methyl group, ethoxy methyl group, 1-ethoxy ethyl group, 2-ethoxy ethyl group, and ethoxy methyl group, but are not limited to these.

Each of L independently represents an alkylene group (alkanediyl group).

An alkylene group is a divalent group derivable by further removing a hydrogen atom from an alkyl group as mentioned above, and may be linear, branched, or cyclic. Specific examples of such an alkyl group are exemplified by the same examples as mentioned above.

The number of carbons of the alkylene group is not particularly limited, but is preferably $C_{40}$ or less, more preferably $C_{30}$ or less, further preferably $C_{20}$ or less, or still further preferably $C_{10}$ or less.

Specific examples of the alkylene group are exemplified by linear alkylene groups such as methylene group, ethylene group, trimethylene group, methyl ethylene group, tetramethylene group, pentamethylene group, hexamethylene group, heptamethylene group, octamethylene group, nonamethylene group, and decamethylene group, branched alkylene groups such as 1-methyl trimethylene group, 2-methyl trimethylene group, 1,1-dimethyl ethylene group, 1-methyl tetramethylene group, 2-methyl tetramethylene group, 1,1-dimethyl trimethylene group, 1,2-dimethyl trimethylene group, 2,2-dimethyl trimethylene group, and 1-ethyl trimethylene group, and cyclic alkylenes such as 1,2-cyclo propanediyl group, 1,2-cyclobutanediyl group, 1,3-cyclobutanediyl group, 1,2-cyclohexanediyl group, and 1,3-cyclohexanediyl group, but are not limited to these.

Among these, $C_{1-10}$ chained alkylene groups are preferable, and $C_{1-5}$ chained alkylene groups are more preferable.

Each of $R^{AC}$ independently represents an alkyl carbonyl group.

An alkyl carbonyl group is a carbonyl group bonded with an alkyl group, and the alkyl group in the alkyl carbonyl group may be linear, branched, or cyclic and specific examples of the alkyl group are exemplified by the same examples as mentioned above.

The number of carbons of the alkyl carbonyl group is not particularly limited, but is preferably $C_{40}$ or less, more preferably $C_{30}$ or less, further preferably $C_{20}$ or less, or still further preferably $C_{10}$ or less.

Specific examples of such an alkyl carbonyl group are exemplified by chained alkyl carbonyl groups such as methyl carbonyl group, ethyl carbonyl group, n-propyl carbonyl group, isopropyl carbonyl group, n-butyl carbonyl group, isobutyl carbonyl group, s-butyl carbonyl group, t-butyl carbonyl group, n-pentyl carbonyl group, 1-methyl-n-butyl carbonyl group, 2-methyl-n-butyl carbonyl group, 3-methyl-n-butyl carbonyl group, 1,1-dimethyl-n-propyl carbonyl group, 1,2-dimethyl-n-propyl carbonyl group, 2,2-dimethyl-n-propyl carbonyl group, 1-ethyl-n-propyl carbonyl group, n-hexyl group, 1-methyl-n-pentyl carbonyl group, 2-methyl-n-pentyl carbonyl group, 3-methyl-n-pentyl carbonyl group, 4-methyl-n-pentyl carbonyl group, 1,1-dimethyl-n-butyl carbonyl group, 1,2-dimethyl-n-butyl carbonyl group, 1,3-dimethyl-n-butyl carbonyl group, 2,2-dimethyl-n-butyl carbonyl group, 2,3-dimethyl-n-butyl-carbonyl group, 3,3-dimethyl-n-butyl carbonyl group, 1-ethyl-n-butyl carbonyl group, 2-ethyl-n-butyl carbonyl group, 1,1,2-trimethyl-n-propyl carbonyl group, 1,2,2-trimethyl-n-propyl carbonyl group, 1-ethyl-1-methyl-n-propyl carbonyl group, and 1-ethyl-2-methyl-n-propyl carbonyl group, cycloalkyl carbonyl groups such as cyclopropyl carbonyl group, cyclobutyl carbonyl group, 1-methyl-cyclopropyl carbonyl group, 2-methyl-cyclopropyl carbonyl group, cyclopentyl carbonyl group, 1-methyl-cyclobutyl carbonyl group, 2-methyl-cyclobutyl carbonyl group, 3-methyl-cyclobutyl carbonyl group, 1,2-dimethyl-cyclopropyl carbonyl group, 2,3-dimethyl-cyclopropyl carbonyl group, 1-ethyl-cyclopropyl carbonyl group, 2-ethyl-cyclopropyl carbonyl group, cyclohexyl carbonyl group, 1-methyl-cyclopentyl carbonyl group, 2-methyl-cyclopentyl carbonyl group, 3-methyl-cyclopentyl carbonyl group, 1-ethyl-cyclobutyl carbonyl group, 2-ethyl-cyclobutyl carbonyl group, 3-ethyl-cyclobutyl carbonyl group, 1,2-dimethyl-cyclobutyl carbonyl group, 1,3-dimethyl-cyclobutyl carbonyl group, 2,2-dimethyl-cyclobutyl carbonyl group, 2,3-dimethyl-cyclobutyl carbonyl group, 2,4-dimethyl-cyclobutyl carbonyl group, 3,3-dimethyl-cyclobutyl carbonyl group, 1-n-propyl-cyclopropyl carbonyl group, 2-n-propyl-cyclopropyl carbonyl group, 1-isopropyl-cyclopropyl carbonyl group, 2-isopropyl-cyclopropyl carbonyl group, 1,2,2-trimethyl-cyclopropyl carbonyl group, 1,2,3-trimethyl-cyclopropyl carbonyl group, 2,2,3-trimethyl-cyclopropyl carbonyl group, 1-ethyl-2-methyl-cyclopropyl carbonyl group, 2-ethyl-1-methyl-cyclopropyl carbonyl group, 2-ethyl-2-methyl-cyclopropyl group, and 2-ethyl-3-methyl-cyclopropyl carbonyl group, bicycloalkyl carbonyl groups such as bicyclobutyl carbonyl group, bicyclopentyl carbonyl group, bicyclohexyl carbonyl group, bicycloheptyl carbonyl group, bicyclooctyl carbonyl group, bicyclononyl carbonyl group, and bicyclodecyl carbonyl group, and the like, but are not limited to these.

Among them, $C_{1-4}$ alkyl carbonyl groups are preferable, and a methyl carbonyl group is more preferable.

Here, each of $r^a$ to $r^f$ represents the number of methylene groups constituting a ring, and is independently an integer of 0 to 4, while each of $r^a$ to $r^f$ is preferably 2 or less, $r^a$, $r^b$, and re are more preferably 1, and $r^c$, $r^d$, and $r^f$ are more preferably 0.

$R^2$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group. As substituents for the alkyl group, the aryl group, the aralkyl group, the halogenated alkyl group, the halogenated aryl group, the halogenated aralkyl group, the alkoxy alkyl group, the alkoxy aryl group, the alkoxy aralkyl group, and the alkenyl group, for example, an alkyl group, an aryl group, an aralkyl group, a halogenated alkyl group, a halogenated aryl group, a halogenated aralkyl group, an alkoxy alkyl group, an alkoxy aryl group, an alkoxy aralkyl group, an alkenyl group, an alkoxy group, an aryloxy group, an aralkyloxy group, and the like are exemplified, and specific examples of these and the suitable number of carbons thereof are the same examples and same number of carbons as described above or below. Moreover, if there are two or more substituents present therein, the two or more substituents may bond with one another to form a ring.

The aryl group may be any one of a phenyl group, a monovalent group derivable by removing one hydrogen atom from a fused-ring aromatic hydrocarbon compound, or a monovalent group derivable by removing one hydrogen atom from a ring-connected aromatic hydrocarbon compound, and the number of carbons is not particularly limited but is preferably $C_{oo}$ or less, more preferably $C_{ao}$ or less, or further preferably $C_{20}$ or less.

Specific examples thereof are exemplified by phenyl group; 1-naphthyl group, 2-naphthyl group, 1-anthryl group, 2-anthryl group, 9-anthryl group, 1-phenanthryl group, 2-phenanthryl, 3-phenanthryl, 4-phenanthryl, 9-phenanthryl, 1-naphthacenyl group, 2-naphthacenyl, 5-naphthacenyl, 2-chrysenyl, 1-pyrenyl group, 2-pyrenyl group, pentacenyl group, benzopyrenyl group, and triphenylenyl group; biphenyl-2-yl group, biphenyl-3-yl group, biphenyl-4-yl group, p-terphenyl-4-yl group, m-terphenyl-4-yl group, o-terphenyl-4-yl group, 1,1'-binaphthyl-2-yl group, 2,2'-binaphthyl-1-yl group; and the like, but are not limited to these.

An aralkyl group is an alkyl group substituted with an aryl group, and specific examples of such an aryl group and such an alkyl group are the same examples as mentioned above.

The number of carbons of the aralkyl group is not particularly limited, but is preferably $C_{40}$ or less, more preferably $C_{30}$ or less, or further preferably $C_{20}$ or less.

Specific examples of the aralkyl group are exemplified by phenyl methyl group (benzyl group), 2-phenylethylene group, 3-phenyl-n-propyl group, 4-phenyl-n-butyl group, 5-pheny-n-pentyl group, 6-phenyl-n-hexyl group, 7-phenyl-n-heptyl group, 8-phenyl-n-octyl group, 9-phenyl-n-nonyl group, 10-phenyl-n-decyl group, and the like, but are not limited to these.

A halogenated alkyl group is an alkyl group substituted with a halogen atom, and specific examples of such an alkyl group are the same examples as mentioned above.

The number of carbons of the halogenated alkyl group is not particularly limited, but is preferably $C_{40}$ or less, more preferably $C_{30}$ or less, further preferably $C_{20}$ or less, or still further preferably $C_{10}$ or less.

Examples of such a halogen atom are exemplified by a fluorine atom, a chlorine atom, a bromine atom, and an iodine atom.

Specific examples of the halogenated alkyl group are exemplified by monofluoromethyl group, a difluoromethyl group, a trifluoromethyl group, bromodifluoromethyl group, 2-chloroethyl group, 2-bromoethyl group, 1,1-difluoroethyl group, 2,2,2-trifluoroethyl group, 1,1,2,2-tetrafluoroethyl group, 2-chloro-1,1,2-trifluoroethyl group, pentafluoroethyl group, 3-bromopropyl group, 2,2,3,3-tetrafluoropropyl group, 1,1,2,3,3,3-hexafluoropropyl group, 1,1,1,3,3,3-hexafluoropropane-2-yl group, 3-bromo-2-methylpropyl group, 4-bromobutyl group, perfluoropentyl group, and the like, but are not limited to these.

A halogenated aryl group is an aryl group substituted with a halogen atom, and specific examples of such an aryl group and a halogen atom are the same examples as mentioned above.

The number of carbons of the halogenated aryl group is not particularly limited, but is preferably $C_{oo}$ or less, more preferably $C_{ao}$ or less, or further preferably $C_{ao}$ or less.

Specific examples of the halogenated aryl group are exemplified by 2-fluorophenyl group, 3-fluorophenyl group, 4-fluorophenyl group, 2,3-difluorophenyl group, 2,4-difluorophenyl group, 2,5-difluorophenyl group, 2,6-difluorophenyl group, 3,4-difluorophenyl group, 3,5-difluorophenyl group, 2,3,4-trifluorophenyl group, 2,3,5-trifluorophenyl group, 2,3,6-trifluorophenyl group, 2,4,5-trifluorophenyl group, 2,4,6-trifluorophenyl group, 3,4,5-trifluorophenyl group, 2,3,4,5-tetrafluorophenyl group, 2,3,4,6-tetrafluorophenyl group, 2,3,5,6-tetrafluorophenyl group, pentafluorophenyl group, 2-fluoro-1-naphthyl group, 3-fluoro-1-naphthyl group, 4-fluoro-1-naphthyl group, 6-fluoro-1-naphthyl group, 7-fluoro-1-naphthyl group, 8-fluoro-1-naphthyl group, 4,5-difluoro-1-naphthyl group, 5,7-difluoro-1-naphthyl group, 5,8-difluoro-1-naphthyl group, 5,6,7,8-tetrafluoro-1-naphthyl group, heptafluoro-1-naphtyl group, 1-fluoro-2-naphthyl group, 5-fluoro-2-naphthyl group, 6-fluoro-2-naphthyl group, 7-fluoro-2-naphthyl group, 5,7-difluoro-2-naphthyl group, heptafluoro-2-naphthyl group, and the like, but are not limited to these.

A halogenated aralkyl group is an aralkyl group substituted with a halogen atom, and specific examples of such an aralkyl group and a halogen atom are the same examples as mentioned above.

The number of carbons of the halogenated aralkyl group is not particularly limited, but is preferably $C_{40}$ or less, more preferably $C_{30}$ or less, or further preferably $C_{20}$ or less.

Specific examples of the halogenated aralkyl group are exemplified by 2-fluorobenzyl group, 3-fluorobenzyl group, 4-fluorobenzyl group, 2,3-difluorobenzyl group, 2,4-difluorobenzyl group, 2,5-difluorobenzyl group, 2,6-difluorobenzyl group, 3,4-difluorobenzyl group, 3,5-difluorobenzyl group, 2,3,4-trifluorobenzyl group, 2,3,5-trifluorobenzyl group, 2,3,6-trifluorobenzyl group, 2,4,5-trifluorobenzyl group, 2,4,6-trifluorobenzyl group, 2,3,4,5-tetrafluorobenzyl group, 2,3,4,6-tetrafluorobenzyl group, 2,3,5,6-tetrafluorobenzyl group, 2,3,4,5,6-pentafluorobenzyl group, and the like, but are not limited to these.

An alkoxy aryl group is an aryl group substituted with an alkoxy group, and specific examples of such an alkoxy group and such an aryl group are exemplified by the same examples as mentioned above.

Specific examples of the alkoxy aryl group are exemplified by 2-methoxyphenyl group, 3-methoxyphenyl group, 4-methoxyphenyl group, 2-(1-ethoxy)phenyl group, 3-(1-ethoxy)phenyl group, 4-(1-ethoxy)phenyl group, 2-(2-ethoxy)phenyl group, 3-(2-ethoxy)phenyl group, 4-(2-ethoxy)phenyl group, 2-methoxynaphthalene-1-yl group, 3-methoxynaphthalene-1-yl group, 4-methoxynaphthalene-1-yl group, 5-methoxynaphthalene-1-yl group, 6-methoxynaphthalene-1-yl group, 7-methoxynaphthalene-1-yl group, and the like, but are not limited to these.

An alkoxy aralkyl group is an aralkyl group substituted with an alkoxy group, and specific examples of such an alkoxy group and such an aralkyl group are exemplified by the same examples as mentioned above.

The number of carbons of the alkoxy aralkyl group is not particularly limited, but is preferably $C_{40}$ or less, more preferably $C_{30}$ or less, or further preferably $C_{20}$ or less.

Specific examples of the alkoxy aralkyl group are exemplified by 3-(methoxyphenyl)benzyl group, 4-(methoxyphenyl)benzyl group, and the like, but are not limited to these.

The alkenyl group may be either linear or branched, and the number of carbons of the alkenyl group is not particularly limited, but is preferably $C_{40}$ or less, more preferably $C_{30}$ or less, further preferably $C_{20}$ or less, or still further preferably $C_{10}$ or less.

Specific examples of the alkenyl group are exemplified by ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butyl ethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, 3-cyclohexenyl group and the like, but the alkenyl group is not limited to these.

Examples of the organic group containing an epoxy group include a glycidoxymethyl group, a glycidoxyethyl group, a glycidoxypropyl group, a glycidoxybutyl group, and an epoxycyclohexyl group, but are not limited to these.

Examples of the organic group containing an acryloyl group include an acryloyl methyl group, an acryloyl ethyl group, and an acryloyl propyl group, but are not limited to these.

Examples of the organic group containing a methacryloyl group include a methacryloyl methyl group, a methacryloyl ethyl group, and a methacryloyl propyl group, but are not limited to these.

Examples of the organic group containing a mercapto group include an ethylmercapto group, a butylmercapto group, a hexylmercapto group, and an octylmercapto group, but are not limited to these.

Examples of the organic group containing an amino group include an amino group, an aminomethyl group, and an aminoethyl group, but are not limited to these.

Examples of the organic group containing a cyano group include a cyanoethyl group and a cyanopropyl group, but are not limited to these.

$R^3$ is a group or an atom bonding to a silicon, and independently represents an alkoxy group, an aralkyloxy group, an acyloxy group, or a halogen atom, and specific examples of the alkoxy group and the halogen atom are exemplified by the same examples as mentioned above.

An aralkyloxy group is a group derivable by removing a hydrogen atom from a hydroxy group of an aralkyl alcohol, and specific examples of such an aralkyl group are exemplified by the same examples as mentioned above.

The number of carbons of the aralkyloxy group is not particularly limited, but is preferably Coo or less, more preferably Cao or less, or further preferably Cao or less.

Specific examples of the aralkyloxy group are exemplified by phenyl methyloxy group (benzyloxy group), 2-phenyl-ethyleneoxy group, 3-phenyl-n-propyloxy group, 4-phenyl-n-butyloxy group, 5-pheny-n-pentyloxy group, 6-phenyl-n-hexyloxy group, 7-phenyl-n-heptyloxy group, 8-phenyl-n-octyloxy group, 9-phenyl-n-nonyloxy group, 10-phenyl-n-decyloxy group, and the like, but are not limited to these.

An acyloxy group is a group derivable by removing a hydrogen atom from a carbonic acid group of a carbonic acid compound, and typical examples of such an acyloxy group are exemplified by alkyl carbonyloxy group, an aryl carbonyloxy group or an aralkyl carbonyloxy group derivable by removing a hydrogen atom from a carbonic acid group of alkyl carbonic acid, aryl carbonic acid, or aralkyl carbonic acid, but are not limited to these. Specific examples of the alkyl group, the aryl group, and aralkyl group of such an alkyl carbonic acid, such an aryl carbonic acid, and such an aralkyl carbonic acid are exemplified by the same examples as describe above.

Specific examples of the acyloxy group are exemplified by methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, tosylcarbonyloxy group, and the like, but are not limited to these.

Here, a is an integer of 0 to 2, but is preferably 0 or 1, or more preferably 0.

In the following, specific examples of the crosslinkable group-containing silane represented by Formula (1) will be exemplified, but the crosslinkable group-containing silane is not limited to these. Note that, in the formulae, each of T independently represents a hydroxy group or a $C_{1-3}$ alkoxy group, but hydroxy group, methoxy group, and ethoxy group are preferable.

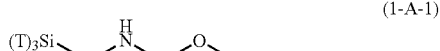
(1-A-1)

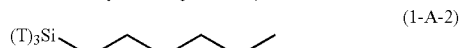
(1-A-2)

(1-A-3)

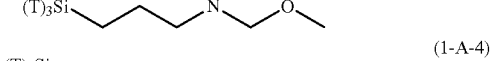
(1-A-4)

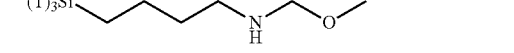
(1-A-5)

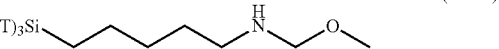
(1-B-1)

(1-B-2)

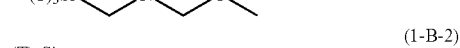
(1-B-3)

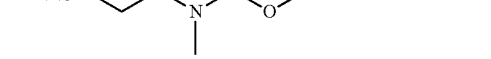
(1-B-4)

(1-B-5)

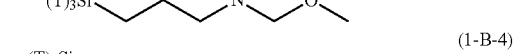
(1-C-1)

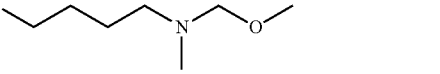
(1-C-2)

(1-C-3)

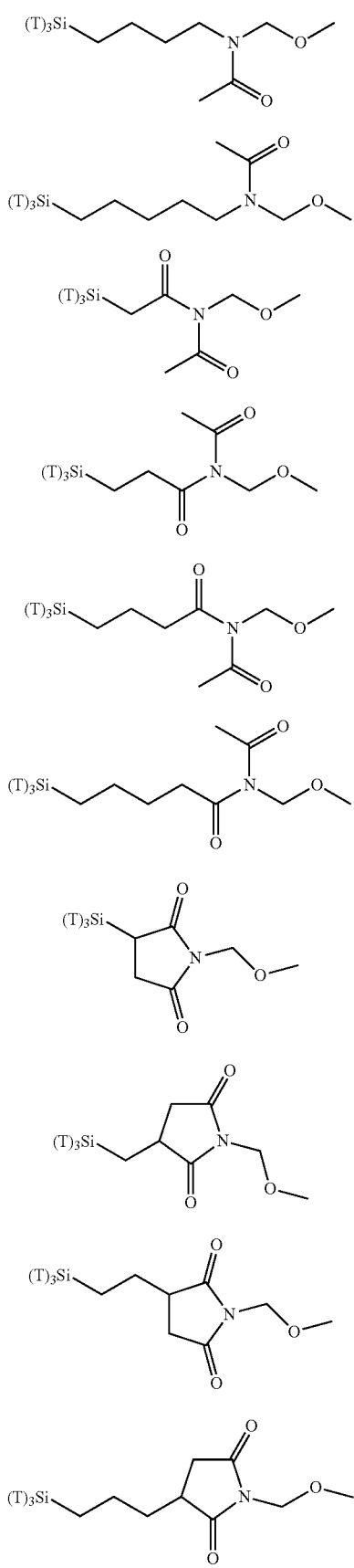
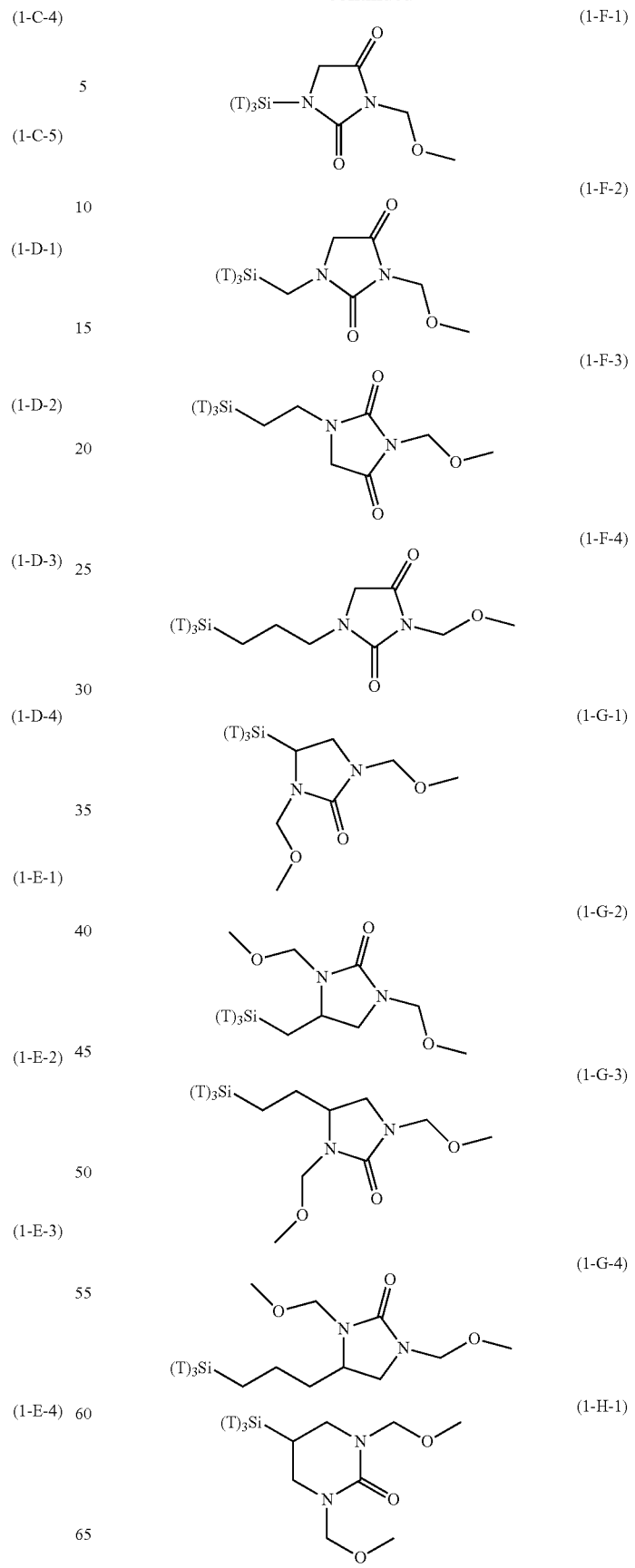

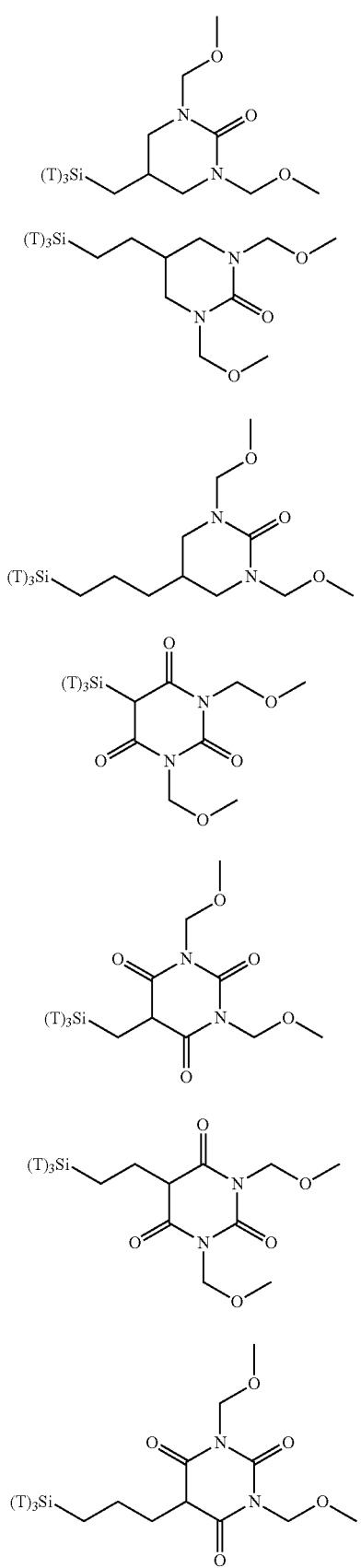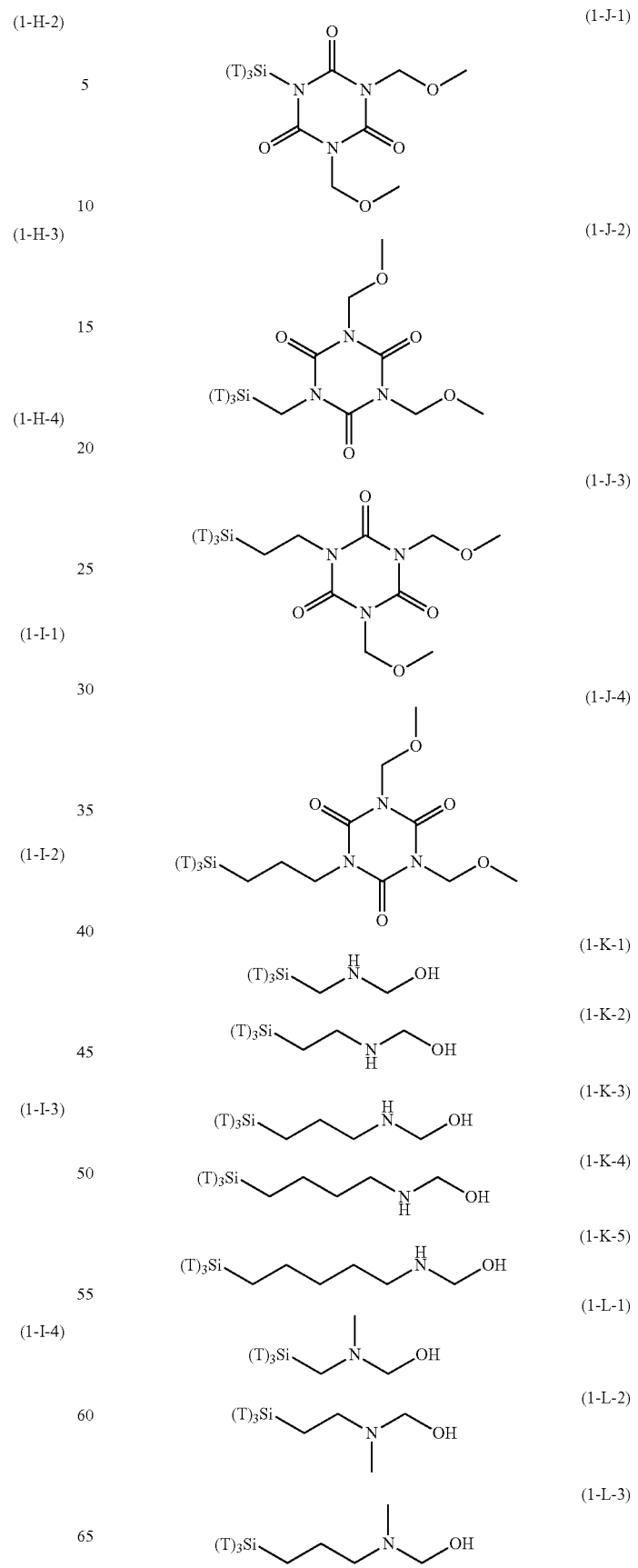

-continued
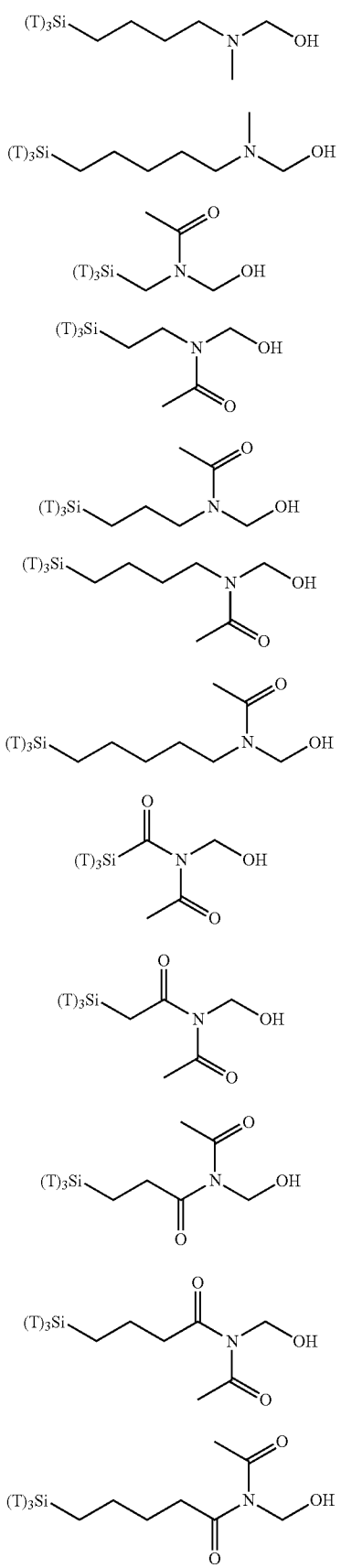
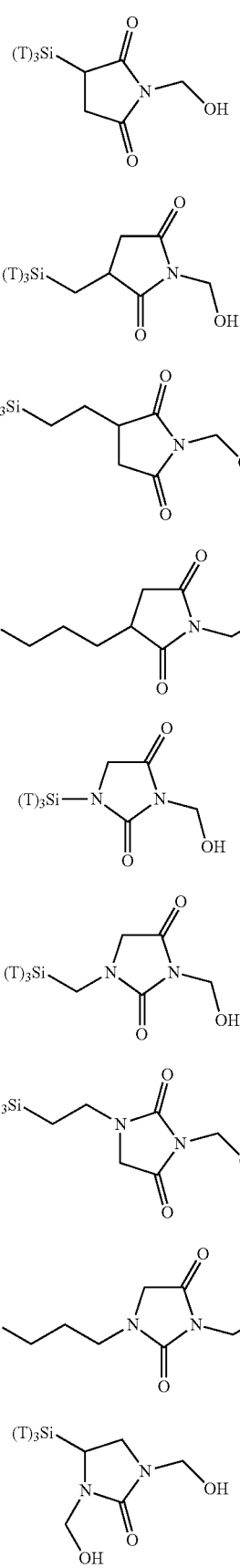

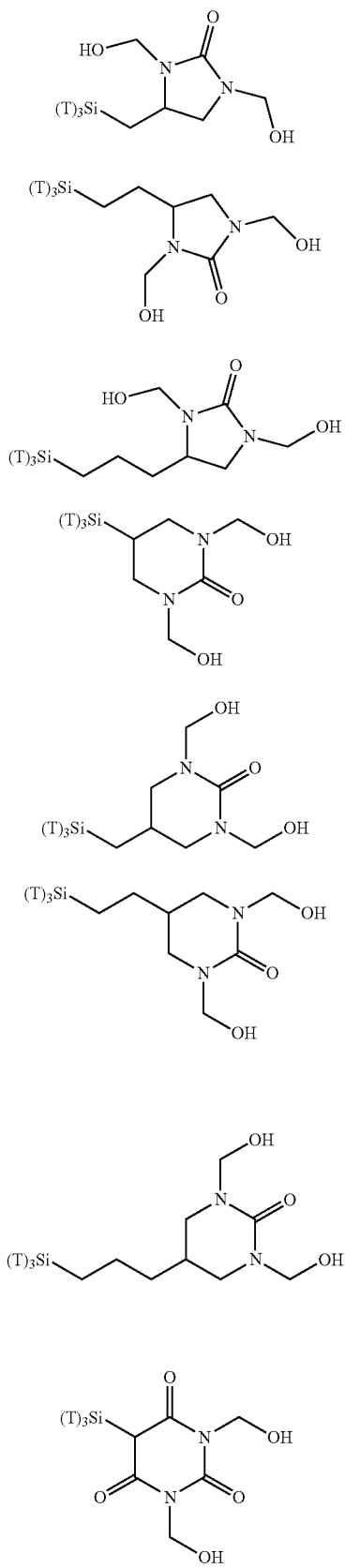
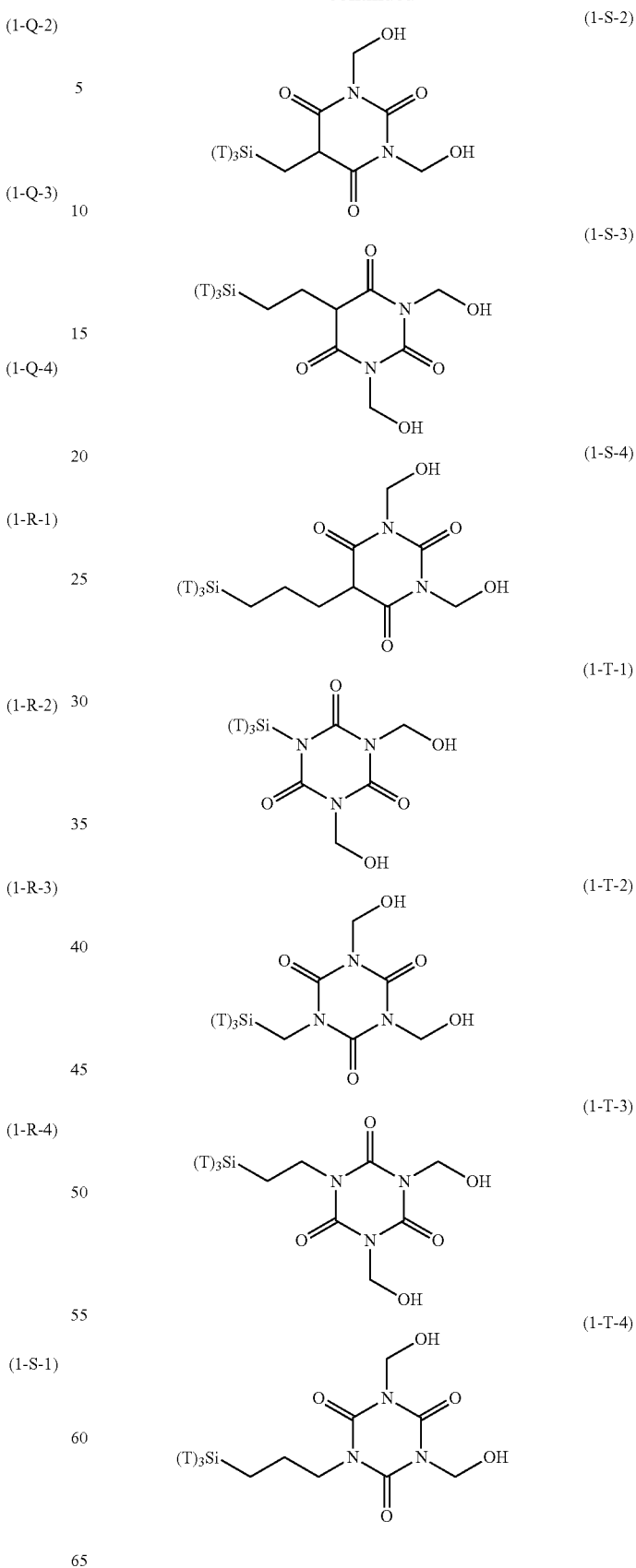
The film-forming composition according to the present invention includes a solvent.

Such a solvent is not particularly limited, as long as the solvent is soluble for the hydrolyzable silane, the hydrolysis product thereof, or the hydrolysis condensate thereof, and the other components described above and below.

Specific examples of such a solvent are exemplified by methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, 2-hydroxy propionic acid ethyl ester, 2-hydroxy-2-methylpropionic acid ethyl ester, ethoxy acetic acid ethyl ester, hydroxy acetic acid ethyl ester, 2-hydroxy-3-methyl butanoic acid methyl ester, 3-methoxy propionic acid methyl ester, 3-methoxy propionic acid ethyl ester, 3-ethoxy propionic acid ethyl ester, 3-ethoxy propionic acid methyl ester, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, hydroxy acetic acid ethyl ester, 2-hydroxy-2-methyl propionic acid ethyl ester, 3-methoxy-2-methyl propionic acid methyl ester, 2-hydroxy-3-methyl butyric acid methyl ester, methoxy acetic acid ethyl ester, ethoxy acetic acid ethyl ester, 3-methoxy propionic acid methyl ester, 3-ethoxy propionic acid ethyl ester, 3-methoxy propionic acid ethyl ester, 3-methoxy butyl acetate, 3-methoxy propyl acetate, 3-methyl-3-methoxy butyl acetate, 3-methyl-3-methoxy butyl propionate, 3-methyl-3-methoxybutyl butyrate, acetoacetic acid methyl ester, toluene, xylene, methyl ethyl ketone, methyl propyl ketone, methyl butyl ketone, 2-heptanone, 3-heptanone, 4-heptanone, cyclohexanone, N,N-dimethyl formamide, N-methyl acetoamide, N,N-dimethyl acetoamide, N-methyl pyrrolidone, 4-methyl-2-pentanol, γ-butyrolactone, and the like, and the solvent may be used solely or two or more kinds of the solvents may be used in combination.

The film-forming composition according to the present invention may include water as the solvent, and a content of the water is preferably 30% by mass or less, more preferably 20% by mass or less, or further preferably 15% by mass or less with respect to the solvent contained in the composition.

In the present invention, for the sake of film property adjustment or the like such as film density, the hydrolyzable silane may include, together with the crosslinkable group-containing silane represented by Formula (1), at least one kind selected from another silane represented by Formula (2) and another silane represented by Formula (3).

Among them, the other silane represented by Formula (2) is preferable.

$$R^{11}{}_b Si(R^{12})_{4-b} \quad (2)$$

$$[R^{21}{}_c Si(R^{22})_{3-c}]_2 Y \quad (3)$$

$R^{11}$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group. $R^{12}$ is a group or an atom bonding to a silicon, and independently represents an alkoxy group, an aralkyloxy group, an acyloxy group, or a halogen atom. $R^{21}$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group. $R^{22}$ is a group or an atom bonding to a silicon, and independently represents an alkoxy group, an aralkyloxy group, an acyloxy group or a halogen atom. Y represents an alkylene group or an arylene group. Specific examples and the suitable number of carbons of these alkyl group, aryl group, aralkyl group, halogenated alkyl group, halogenated aryl group, halogenated aralkyl group, alkoxy alkyl group, alkoxy aryl group, alkoxy aralkyl group, alkenyl group, alkoxy group, aralkyloxy group, acyloxy group, halogen atom and organic group that contains an epoxy group, an acryloyl group, a methacryloyl group, a mercapto group, an amino group, or a cyano group, and substituents for the alkylene group as well as the alkyl group, the aryl group, the aralkyl group, the halogenated alkyl group, the halogenated aryl group, the halogenated aralkyl group, the alkoxy alkyl group, the alkoxy aryl group, the alkoxy aralkyl group, and the alkenyl group are exemplified by the same examples and number of carbons as mentioned above.

An arylene group is a divalent group derivable by further removing a hydrogen atom from an aryl group, and specific examples of such an aryl group are exemplified by the same examples as mentioned above.

The number of carbons of the arylene group is not particularly limited, but is preferably $C_{40}$ or less, more preferably $C_{30}$ or less, or further preferably $C_{20}$ or less.

Specific examples of the arylene group are exemplified by 1,2-phenylene group, 1,3-phenylene group, and 1,4-phenylene group; groups derivable by removing two hydrogen atoms from an aromatic ring of a fused-ring aromatic hydrocarbon compound such as 1,5-naphthalenediyl group, 1,8-naphthalenediyl group, 2,6-naphthalenediyl group, 2,7-naphthalenediyl group, 1,2-anthracenediyl group, 1,3-anthracenediyl group, 1,4-anthracenediyl group, 1,5-anthracenediyl group, 1,6-anthracenediyl group, 1,7-anthracenediyl group, 1,8-anthracenediyl group, 2,3- anthracenediyl group, 2,6-anthracenediyl group, 2,7-anthracenediyl group, 2,9-anthracenediyl group, 2,10-anthracenediyl group, and 9,10-anthracenediyl group; groups derivable by removing two hydrogen atoms from an aromatic ring of a ring-connected aromatic hydrocarbon compound of 4,4'-biphenyldiyl group and 4,4''-p-terophenyldiyl group; and the like, but are not limited to these.

Here, b represents an integer of 0 to 3, but is preferably 0 or 1, or more preferably 0.

Here, c independently represents an integer of 0 to 2, but is preferably 0 or 1, or more preferably 0.

Specific examples of the other silane represented by Formula (2) are exemplified by tetramethoxy silane, tetrachlorosilane, tetraacetoxy silane, tetraethoxy silane, tetra-n-propoxy silane, tetraisopropoxy silane, tetra-n-butoxy silane, methyl trimethoxy silane, methyl trichlorosilane, methyl triacetoxy silane, methyl tripropoxy silane, methyl tributoxy silane, methyl triamiloxy silane, methyl triphenoxy silane, methyl tribenzyloxy silane, methyl triphenethyloxy silane, glycidoxy methyhl trimethoxy silane, glycidoxy methyl triethoxy silane, α-glycidoxy ethyl trimethoxy silane, α-glycidoxy ethyl triethoxy silane, β-glycidoxy ethyl trimethoxy silane, β-glycidoxy ethyl triethoxy silane, α-glycidoxy propyl trimethoxy silane, α-glycidoxy propyl triethoxy silane, β-glycidoxy propyl trimethoxy silane, β-glycidoxy propyl triethoxy silane, γ-glycidoxy propyl trimethoxy silane, γ-glycidoxy propyl triethoxy silane, γ-glycidoxy propyl tripropoxy silane, γ-glycidoxy propyl tributoxy silane, γ-glycidoxy propyl triphenoxy silane, α-glycidoxy butyl trimethoxy silane, α-glycidoxy butyl triethoxy silane, β-glycidoxy butyl triethoxy silane, γ-glycidoxy butyl trimethoxy silane, γ-glycidoxy butyl triethoxy silane, δ-glycidoxy butyl trimethoxy silane, δ-glycidoxy butyl triethoxy silane, (3,4-epoxy cyclohexyl)methyl trimethoxy silane, (3,4-epoxy cyclohexyl)methyl triethoxy silane, β-(3,4-epoxy cyclohexyl)ethyl trimethoxy silane, (3-(3,4-epoxy cyclohexyl)ethyl triethoxy silane, β(3,4-epoxy cyclohexyl)ethyl tripropoxy silane, β-(3,4-epoxy cyclohexyl)ethyl tributoxy silane, β-(3,4-epoxy cyclohexyl)ethyl triphenoxy silane, γ-(3,4-epoxy cyclohexyl)propyl trimethoxy silane, γ-(3,4-epoxy cyclohexyl)propyl triethoxy silane, δ-(3,4-epoxy cyclohexyl)butyl trimethoxy silane, δ-(3,4-epoxy cyclohexyl)butyl triethoxy silane, glycidoxy methyl methyl dimethoxy silane, glycidoxy methyl methyl diethoxy silane, α-glycidoxy ethyl methyl dimethoxy silane, α-glycidoxy ethyl methyl diethoxy silane, β-glycidoxy ethyl methyl dimethoxy silane, β-glycidoxy ethyl ethyl dimethoxy silane, α-glycidoxy propyl methyl dimethoxy silane, α-glycidoxy propyl methyl diethoxy silane, β-glycidoxy propyl methyl dimethoxy silane, β-glycidoxy propyl ethyl dimethoxy silane, γ-glycidoxy propyl methyl dimethoxy silane, γ-glycidoxy propyl methyl diethoxy silane, γ-glycidoxy propyl methyl dipropoxy silane, γ-glycidoxy propyl methyl dibutoxy silane, γ-glycidoxy propyl methyl diphenoxy silane, γ-glycidoxy propyl ethyl dimethoxy silane, γ-glycidoxy propyl ethyl diethoxy silane, γ-glycidoxy propyl vinyl dimethoxy silane, γ-glycidoxy propyl vinyl diethoxy silane, ethyl trimethoxy silane, ethyl triethoxy silane, vinyl trimethoxy silane, vinyl trichloro silane, vinyl triacetoxy silane, vinyl triethoxy silane, methoxy phenyl trimethoxy silane, methoxy phenyl triethoxy silane, methoxy phenyl triacetoxy silane, methoxy phenyl trichlorosilane, methoxy benzyl trimethoxy silane, methoxy benzyl triethoxy silane, methoxy benzyl triacetoxy silane, methoxy benzyl trichloro silane, methoxy phenethyl trimethoxy silane, methoxy phenethyl triethoxy silane, methoxy phenethyl triacetoxy silane, methoxy phenethyl trichloro silane, ethoxy phenyl trimethoxy silane, ethoxy phenyl triethoxy silane, ethoxy phenyl triacetoxy silane, ethoxy phenyl trichloro silane, ethoxy benzyl trimethoxy silane, ethoxy benzyl triethoxy silane, ethoxy benzyl triacetoxy silane, ethoxy benzyl trichloro silane, isopropoxy phenyl trimethoxy silane, isopropoxy phenyl triethoxy silane, isopropoxy phenyl triacetoxy silane, isopropoxy phenyl trichloro silane, isopropoxy benzyl trimethoxy silane, isopropoxy benzyl triethoxy silane, isopropoxy benzyl triacetoxy silane, isopropoxy benzyl trichloro silane, t-butoxy phenyl trimethoxy silane, t-butoxy phenyl triethoxy silane, t-butoxy phenyl triacetoxy silane, t-butoxy phenyl trichlorosilane, t-butoxy benzyl trimethoxy silane, t-butoxy benzyl triethoxy silane, t-butoxy benzyl triacetoxy silane, t-butoxy benzyl trichlorosilane, methoxy naphthyl trimethoxy silane, methoxy naphthyl triethoxy silane, methoxy naphthyl triacetoxy silane, methoxy naphthyl trichloro silane, ethoxy naphthyl trimethoxy silane, ethoxy naphthyl triethoxy silane, ethoxy naphthyl triacetoxy silane, ethoxy naphthyl trichloro silane, γ-chloropropyl trimethoxy silane, γ-chloropropyl triethoxy silane, γ-chloropropyl triacetoxy silane, 3,3,3-trifluoropropyl trimethoxy silane, γ-methacryloxy propyl trimethoxy silane, γ-mercaptopropyl trimethoxy silane, γ-mercaptopropyl triethoxy silane, β-cyanoethyl triethoxy silane, chloromethyl trimethoxy silane, chloromethyl triethoxy silane, dimethyl dimethoxy silane, phenyl methyl dimethoxy silane, dimethyl diethoxy silane, phenyl methyl diethoxy silane, γ-chloropropyl methyl dimethoxy silane, γ-chloropropyl methyl diethoxy silane, dimethyl diacetoxy silane, γ-methacryloxy propyl methyl dimethoxy silane, γ-methacryloxy propyl methyl diethoxy silane, γ-mercaptopropyl methyl dimethoxy silane, γ-mercaptomethyl diethoxy silane, methyl vinyl dimethoxy silane, methyl vinyl diethoxy silane, silanes represented by Formulae (A-1) to (A-41), and the like, but are not limited to these.

Among them, for the sake of improving the crosslinking density of the film obtained from the composition according to the present invention so as to reduce diffusion of the component of the resist film into the film obtained, so that the resist property of the resist film is maintained or improved, and the like, tetrafunctional silanes such as tetramethoxy silane and tetraethoxy silane are preferable.

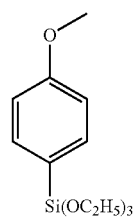

Formula (A-1)

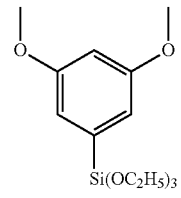

Formula (A-2)

Formula (A-3)
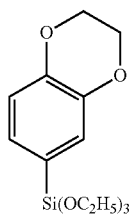
Formula (A-4)
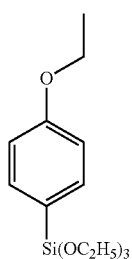
Formula (A-5)
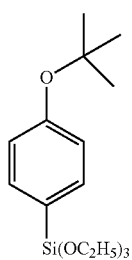
Formula (A-6)
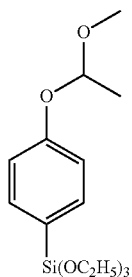
Formula (A-7)
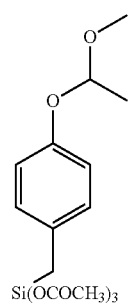
Formula (A-8)
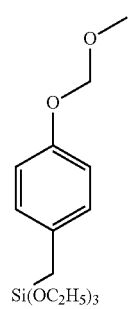
Formula (A-9)
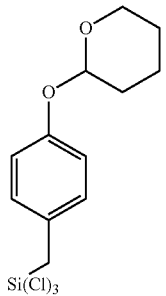
Formula (A-10)
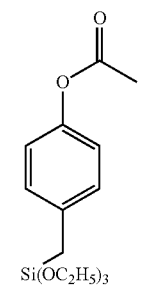
Formula (A-11)
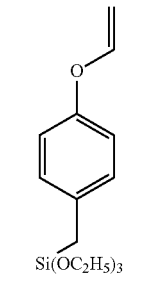
Formula (A-12)
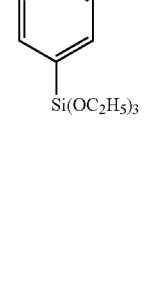
Formula (A-13)

Formula (A-14)
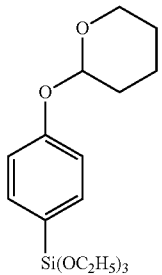
Formula (A-15)
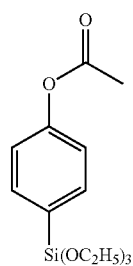
Formula (A-16)
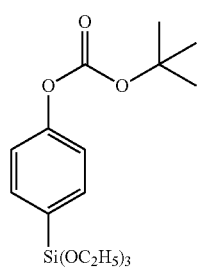
Formula (A-17)
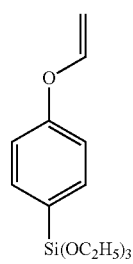
Formula (A-18)
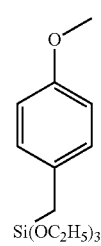
Formula (A-19)
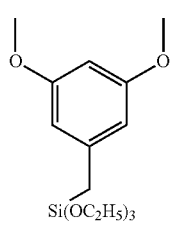
Formula (A-20)
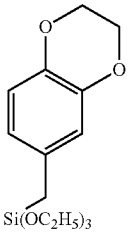
Formula (A-21)
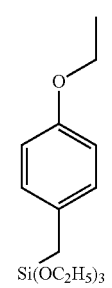
Formula (A-22)
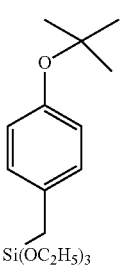
Formula (A-23)
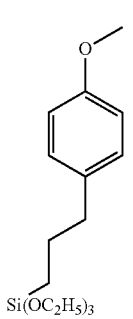
Formula (A-24)
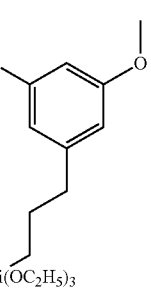

Formula (A-25)
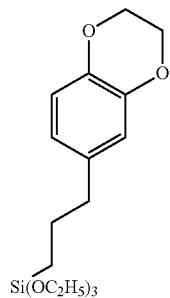
Formula (A-26)
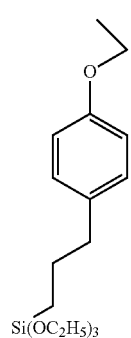
Formula (A-27)
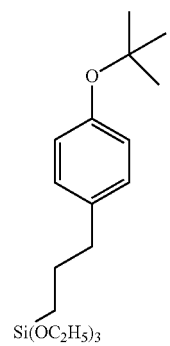
Formula (A-28)
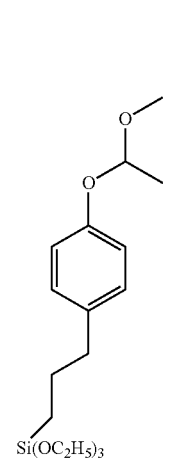
Formula (A-29)
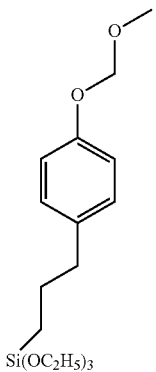
Formula (A-30)
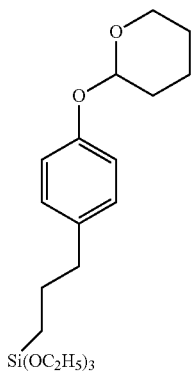
Formula (A-31)
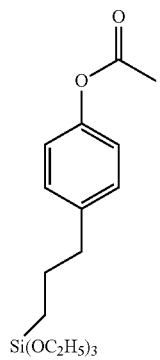
Formula (A-32)
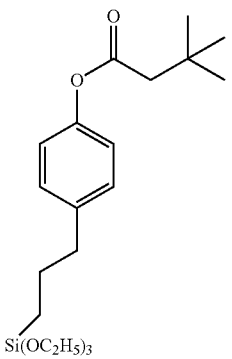

Formula (A-33)
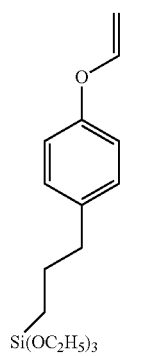

Formula (A-34)
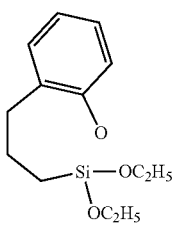

Formula (A-35)
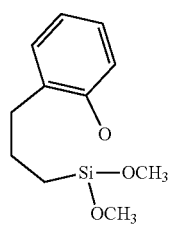

Formula (A-36)

Formula (A-37)
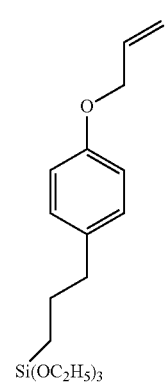

Formula (A-38)
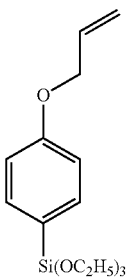

Formula (A-39)
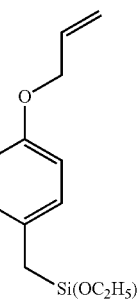

Formula (A-40)
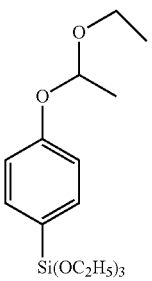

Formula (A-41)
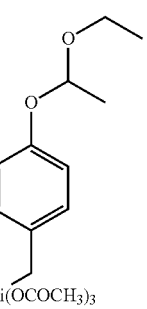

Specific examples of the other silane represented by Formula (3) are exemplified by methylene bistrimethoxy silane, methylene bistrichlorosilane, methylene bistriacetoxy silane, ethylene bistriethoxy silane, ethylene bistrichlorosilane, ethylene bistriacetoxy silane, propylene bistriethoxy silane, butylene bistrimethoxy silane, phenylene bistrimethoxy silane, phenylene bistriethoxy silane, phenylene bismethyl diethoxy silane, phenylene bismethyl dimethoxy silane, naphthlene bistrimethoxy silane, bistrimethoxy disilane, bistriethoxy disilane, bisethyl diethoxy disilane, bismethyl dimethoxy disilane, and the like, but are not limited to these.

In the present invention, the hydrolyzable silane may contain a hydrolyzable organosilane, having an onium group in its molecule. With the hydrolyzable organosilane, having an onium group in its molecule, it becomes possible to effectively and efficiently facilitate the crosslinking reaction of the hydrolyzable silane.

One suitable example of the hydrolyzable organosilane, having an onium group in its molecule is represented by Formula (4).

$$R^{31}_e R^{32}_f Si(R^{33})_{4-(e+f)} \quad (4)$$

$R^{31}$ is a group bonding to a silicon atom and is independently an onium group or an organic group containing an onium group. $R^{32}$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or is an organic group containing an epoxy group, an acryloyl group, a methacryloyl group, a mercapto group, an amino group or a cyano group. $R^{33}$ is independently a group or an atom bonding to a silicon atom, and is an alkoxy group, an aralkyloxy group, an acyloxy group, or a halogen atom. Here, e represents 1 or 2 and f represents 0 or 1, satisfying $1 \leq e+f \leq 2$.

Specific examples and the suitable number of carbons of these alkyl group, aryl group, aralkyl group, halogenated alkyl group, halogenated aryl group, halogenated aralkyl group, alkoxy alkyl group, alkoxy aryl group, alkoxy aralkyl group, alkenyl group, alkoxy group and the organic group that contains an epoxy group, an acryloyl group, a methacryloyl group, a mercapto group, an amino group, or a cyano group, and substituents for the alkyl group, the aryl group, the aralkyl group, the alkyl group, the halogenated aryl group, the halogenated aralkyl group, the alkoxy alkyl group, the alkoxy aryl group, the alkoxy aralkyl group, and the alkenyl group are exemplified by the same examples and number of carbons as mentioned above.

Speaking in more detail, specific examples of the onium group are exemplified by cyclic ammonium groups or chained ammonium groups, and tertiary ammonium groups or quaternary ammonium groups are preferable.

In other words, suitable specific examples of the onium group or the organic group containing the onium group are exemplified by cyclic ammonium groups or chained ammonium groups or organic groups containing at least one of these, and the onium group or the organic group containing the onium group is preferably a tertiary ammonium group or a quaternary ammonium group, or an organic group containing at least one of these.

Note that, in a case where the onium group is a cyclic ammonium group, a nitrogen atom constituting the ammonium group is also an atom constituting the ring. In this situation, there are a case where the nitrogen atom constituting the ring and the silicon atom are bonded with each other directly or via a divalent linking group, and a case where a carbon atom constituting the ring and the silicon atom are bonded with each other directly or via a divalent linking group.

In one example of a suitable aspect of the present invention, $R^{31}$ is a hetero aromatic cyclic ammonium group represented by Formula (S1).

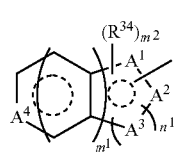

(S1)

Each of $A^1$, $A^2$, $A^3$, and $A^4$ independently represents a group represented by any of Formulae (J1) to (J3), where at least one of $A^1$ to $A^4$ is a group represented by Formula (J2), and depending on which one of $A^1$ to $A^4$ the silicon atom in Formula (4) bonds with, the bonding between respective $A^1$ to $A^4$ and the atoms adjacent to the respective ones of $A^1$ to $A^4$ and constituting the ring therewith is decided to be a single bond or a double bond, so that the ring thus constituted shows an aromatic property.

(J1)

(J2)

(J3)

Each of $R^{30}$ independently represents a single bond, a hydrogen atom, an alkyl group, an aryl group, an aralkyl group, a halogenated alkyl group, a halogenated aryl group, a halogenated aralkyl group, or an alkenyl group, and specific examples and suitable number of carbons of the alkyl group, the aryl group, the aralkyl group, the halogenated alkyl group, the halogenated aryl group, the halogenated aralkyl group, and the alkenyl group are exemplified by the same examples and number of carbons as mentioned above.

$R^{34}$ independently represents an alkyl group, an aryl group, an aralkyl group, a halogenated alkyl group, a halogenated aryl group, a halogenated aralkyl group, an alkenyl group, or a hydroxy group, and in a case where there are two or more $R^{34}$, two of $R^{34}$ may bond with each other to form a ring, and the ring formed with the two of $R^{34}$ may be a crosslinking ring structure, and the cyclic ammonium group in such a case has an adamantane ring, a norbornene ring, a spiro ring, or the like.

Specific examples and suitable number of carbons of the alkyl group, the aryl group, the aralkyl group, the halogenated alkyl group, the halogenated aryl group, the halogenated aralkyl group, and the alkenyl group are exemplified by the same examples and number of carbons as mentioned above.

Here, $n^1$ is an integer of 1 to 8, $m^1$ is 0 or 1, and $m^2$ is 0 or a positive integer from 1 to a maximum number of possible substitutions in the single ring or the polycyclic ring.

In a case where $m^1$ is 0, a $(4+n^1)$-membered ring including $A^1$ to $A^4$ is constituted. That is, in a case where $n^1$ is 1, a five-membered ring is constituted. In a case where $n^1$ is 2, a six-membered ring is constituted. In a case where $n^1$ is 3, a seven-membered ring is constituted. In a case where $n^1$ is 4, an eight-membered ring is constituted. In a case where $n^1$ is 5, a nine-membered ring is constituted. In a case where $n^1$ is 6, a ten-membered ring is constituted. In a case where $n^1$ is 7, an eleven-membered ring is constituted. In a case where $n^1$ is 8, a twelve-membered ring is constituted.

In a case where $m^1$ is 1, a fused ring in which a $(4+n')$-membered ring including $A^1$ to $A^3$ and a six-membered ring including $A^4$ are fused together is formed.

$A^1$ to $A^4$ may or may not have a hydrogen atom on an atom which constitutes the ring, depending on which one of Formulae (J1) to (J3) represents $A^1$ to $A^4$. In a case where $A^1$ to $A^4$ have a hydrogen atom on an atom which is a member of the ring, the hydrogen atom may be substituted with $R^{34}$. As an alternative, $R^{34}$ may substitute a ring-constituting atom other than the ring-constituting atom in $A^1$ to $A^4$. In view of these circumstances, as described above, $m^2$ is selected from 0 and an integer from 1 to a maximum number of possible substitutions in the single ring or the polycyclic ring.

A bonding hand of a hetero aromatic cyclic ammonium group represented by Formula (S1) is present on a carbon atom or a nitrogen atom present on such a single ring or such a fused ring, and bonds with a silicon atom directly, or bonds with a linking group, so that an organic group containing the cyclic ammonium is formed and bonds with the silicon atom.

Such a linking group is exemplified by an alkylene group, an arylene group, an alkenylene group, and the like, but is not limited to these.

Specific examples of the alkylene group and the arylene group and suitable number of carbons thereof are the same examples and number of carbons as mentioned above.

An alkenylene group is a divalent group derivable by further removing a hydrogen atom from an alkenyl group, and specific examples of such an alkenyl group are exemplified by the same examples as mentioned above.

The number of carbons of the alkenylene group is not particularly limited, but is preferably $C_{40}$ or less, more preferably $C_{30}$ or less, or further preferably $C_{20}$ or less.

Specific examples thereof are exemplified by vinylene, 1-methyl vinylene, propenylene, 1-butenylene, 2-butenylene, 1-pentenylene, 2-pentenylene group, and the like, but are not limited to these.

Specific examples of a hydrolyzable organosilane represented by Formula (4) having a hetero aromatic cyclic ammonium group represented by Formula (S1) will be exemplified but are not limited to these.

Formula (I-1)

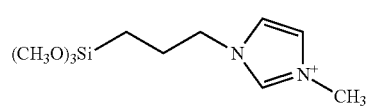

Formula (I-2)

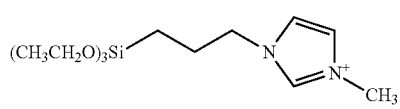

Formula (I-3)

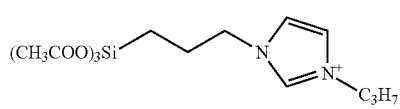

Formula (I-4)

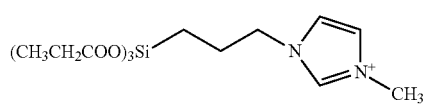

Formula (I-5)

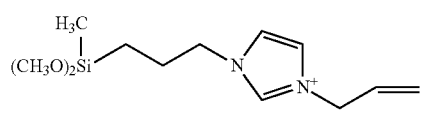

Formula (I-6)

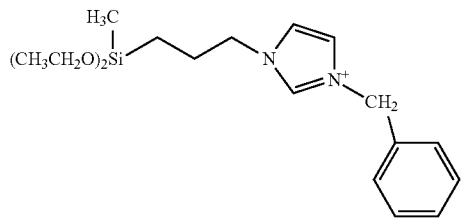

Formula (I-7)

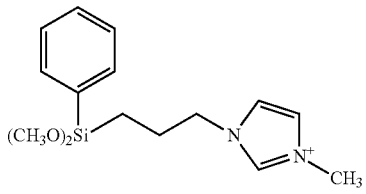

Formula (I-8)

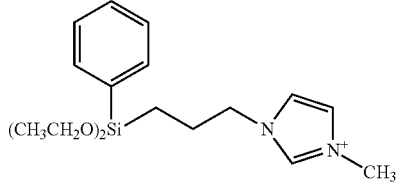

Formula (I-9)

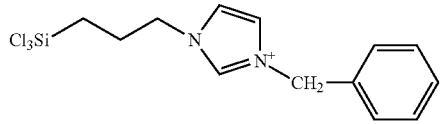

Formula (I-10)

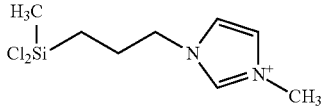

Formula (I-12)

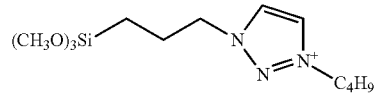

Formula (I-13)

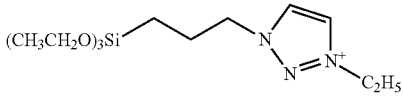

Formula (I-14)

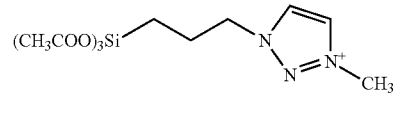

Formula (I-15)

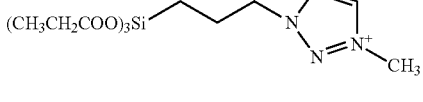

Formula (I-16)

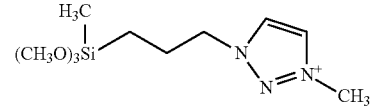

Formula (I-17)

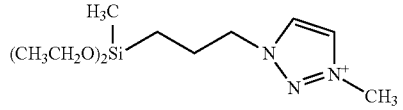

Formula (I-18)
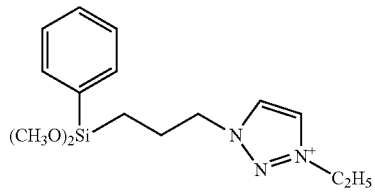
Formula (I-19)
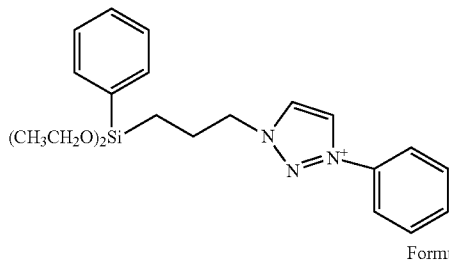
Formula (I-20)
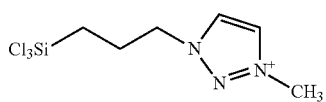
Formula (I-21)
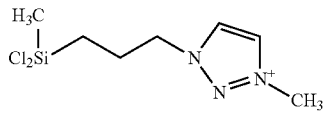
Formula (I-22)
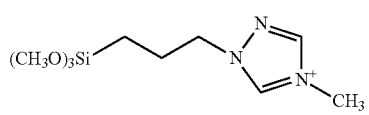
Formula (I-23)
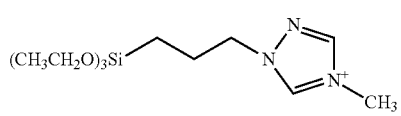
Formula (I-24)
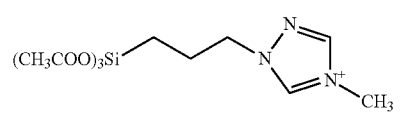
Formula (I-25)
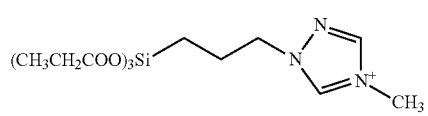
Formula (I-26)
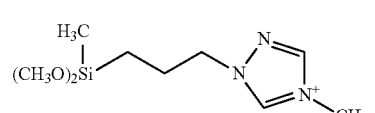
Formula (I-27)
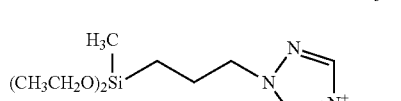
Formula (I-28)
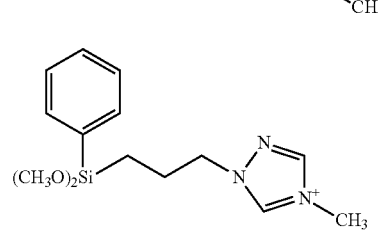
Formula (I-29)
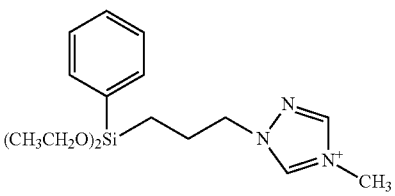
Formula (I-30)
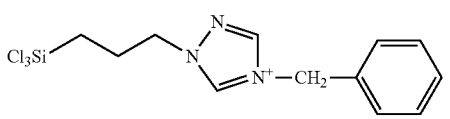
Formula (I-31)
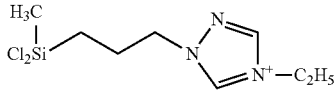
Formula (I-32)
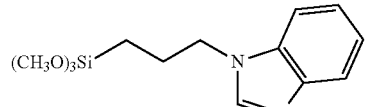
Formula (I-33)
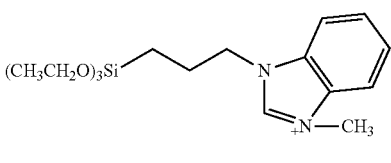
Formula (I-34)
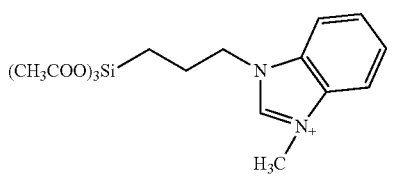
Formula (I-35)
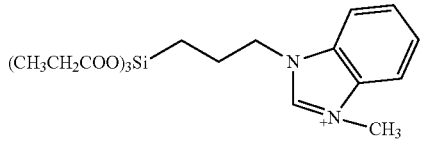
Formula (I-36)
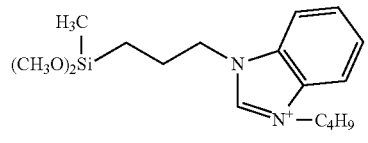
Formula (I-37)
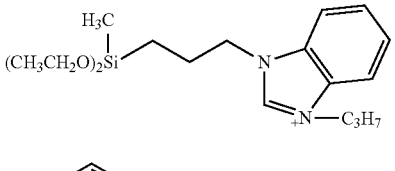
Formula (I-38)
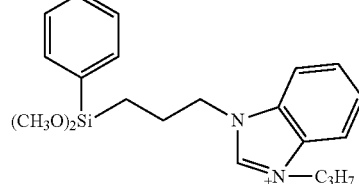

Formula (I-39)
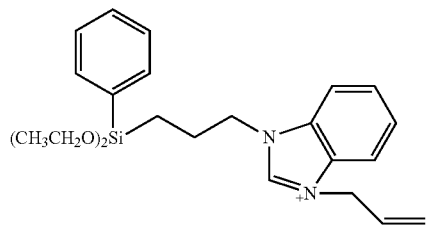

Formula (I-40)
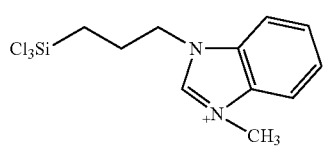

Formula (I-41)
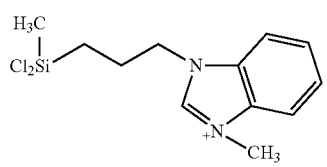

Formula (I-71)
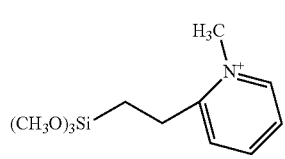

Formula (I-72)
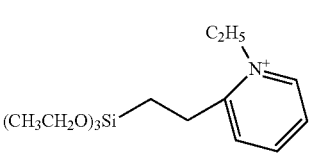

Formula (I-73)
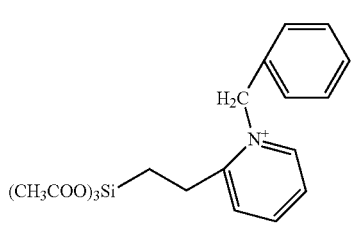

Formula (I-74)
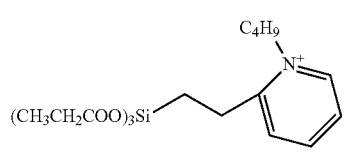

Formula (I-75)
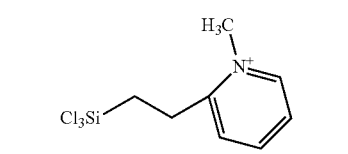

Formula (I-76)
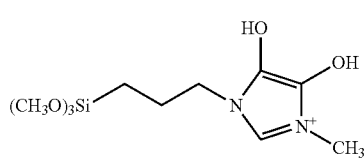

Formula (I-77)
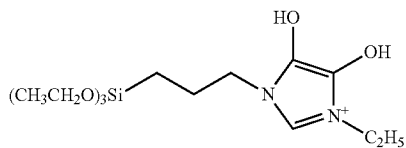

Formula (I-78)
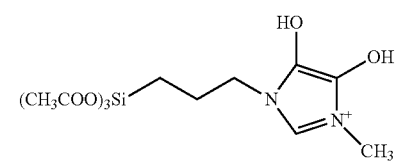

Formula (I-79)
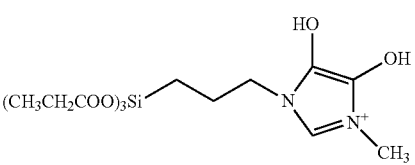

Formula (I-80)
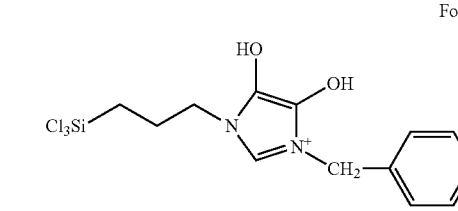

In other examples of suitable aspects of the present invention, $R^{31}$ is a hetero aliphatic cyclic ammonium group represented by Formula (S2).

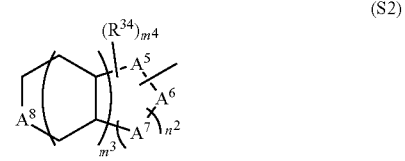
(S2)

Each of $A^5$, $A^6$, $A^7$, and $A^8$ independently represents a group represented by any of Formulae (J4) to (J6), where at least one of $A^5$ to $A^8$ is a group represented by Formula (J5), and depending on which one of $A^5$ to $A^8$ the silicon atom in Formula (4) bonds with, the bonding between respective $A^5$ to $A^8$ and the atoms adjacent to the respective ones of $A^5$ to $A^8$ and constituting the ring therewith is decided to be a single bond or a double bond, so that the ring thus constituted shows a non-aromatic property.

(J4)

(J5)

-continued

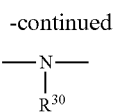
(J6)

Each of $R^{30}$ independently represents a single bond, a hydrogen atom, an alkyl group, an aryl group, an aralkyl group, a halogenated alkyl group, a halogenated aryl group, a halogenated aralkyl group, or an alkenyl group, and specific examples and suitable number of carbons of the alkyl group, the aryl group, the aralkyl group, the halogenated alkyl group, the halogenated aryl group, the halogenated aralkyl group, and the alkenyl group are exemplified by the same examples and number of carbons as mentioned above.

$R^{35}$ independently represents an alkyl group, an aryl group, an aralkyl group, a halogenated alkyl group, a halogenated aryl group, a halogenated aralkyl group, an alkenyl group, or a hydroxy group, and in a case where there are two or more $R^{35}$, two of $R^{35}$ may bond with each other to form a ring, and the ring formed with the two of $R^{35}$ may be a cross-linking ring structure, and the cyclic ammonium group in such a case has an adamantane ring, a norbornene ring, a spiro ring, or the like.

Specific examples and suitable number of carbons of the alkyl group, the aryl group, the aralkyl group, the halogenated alkyl group, the halogenated aryl group, the halogenated aralkyl group, and the alkenyl group are exemplified by the same examples and number of carbons as mentioned above.

Here, $n^2$ is an integer of 1 to 8, and $m^3$ is 0 or 1, and $m^4$ is 0 or a positive integer from 1 to a maximum number of possible substitutions in the single ring or the polycyclic ring.

In a case where $m^3$ is 0, a $(4+n^2)$-membered ring including $A^5$ to $A^8$ is constituted. That is, in a case where $n^2$ is 1, a five-membered ring is constituted. In a case where $n^2$ is 2, a six-membered ring is constituted. In a case where $n^2$ is 3, a seven-membered ring is constituted. In a case where $n^2$ is 4, an eight-membered ring is constituted. In a case where $n^2$ is 5, a nine-membered ring is constituted. In a case where $n^2$ is 6, a ten-membered ring is constituted. In a case where $n^2$ is 7, an eleven-membered ring is constituted. In a case where $n^2$ is 8, a twelve-membered ring is constituted.

In a case where $m^3$ is 1, a fused ring in which a $(4+n^2)$-membered ring including $A^5$ to $A^7$ and a six-membered ring including $A^8$ are fused together is formed.

$A^5$ to $A^8$ may or may not have a hydrogen atom on an atom which constitutes the ring, depending on which one of Formulae (J4) to (J6) represents $A^5$ to $A^8$. In a case where $A^5$ to $A^8$ have a hydrogen atom on an atom which is a member of the ring, the hydrogen atom may be substituted with $R^{35}$. As an alternative, $R^{35}$ may substitute a ring-constituting atom other than the ring-constituting atom in $A^5$ to $A^8$.

In view of these circumstances, as described above, $m^4$ is selected from 0 and an integer from 1 to a maximum number of possible substitutions in the single ring or the polycyclic ring.

A bonding hand of a hetero aliphatic cyclic ammonium group represented by Formula (S2) is present on a carbon atom or a nitrogen atom present on such a single ring or such a fused ring, and bonds with a silicon atom directly, or bonds with a linking group, so that an organic group containing the cyclic ammonium is formed and bonds with the silicon atom.

Such a linking group is exemplified by an alkylene group, an arylene group, or an alkenylene group, and specific examples of the alkylene group, the arylene group, and the alkenylene group, and suitable number of carbons thereof are the same examples and number of carbons as mentioned above.

Specific examples of a hydrolyzable organosilane represented by Formula (4) having a hetero aliphatic cyclic ammonium group represented by Formula (S2) will be exemplified but are not limited to these.

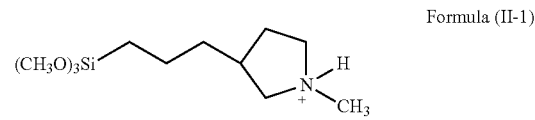
Formula (II-1)

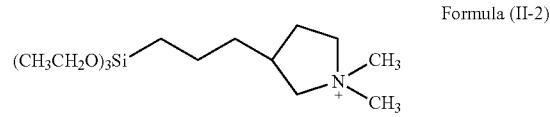
Formula (II-2)

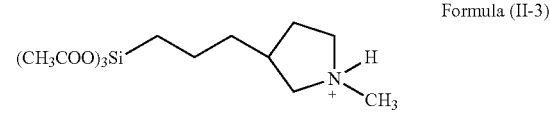
Formula (II-3)

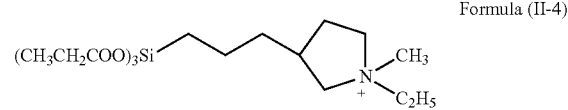
Formula (II-4)

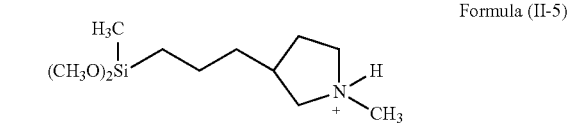
Formula (II-5)

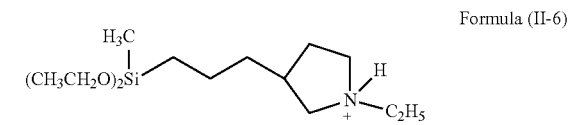
Formula (II-6)

Formula (II-7)

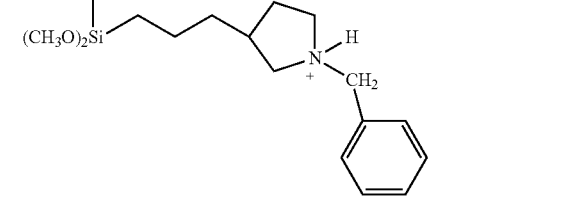
Formula (II-8)

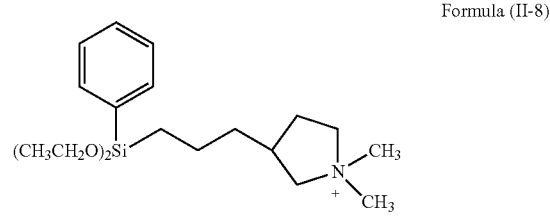
Formula (II-9)

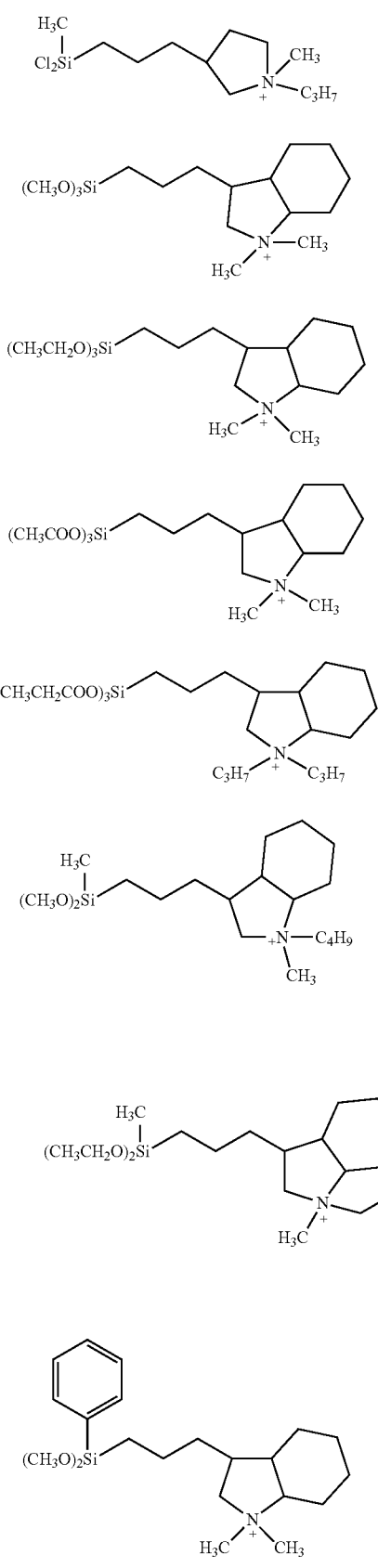
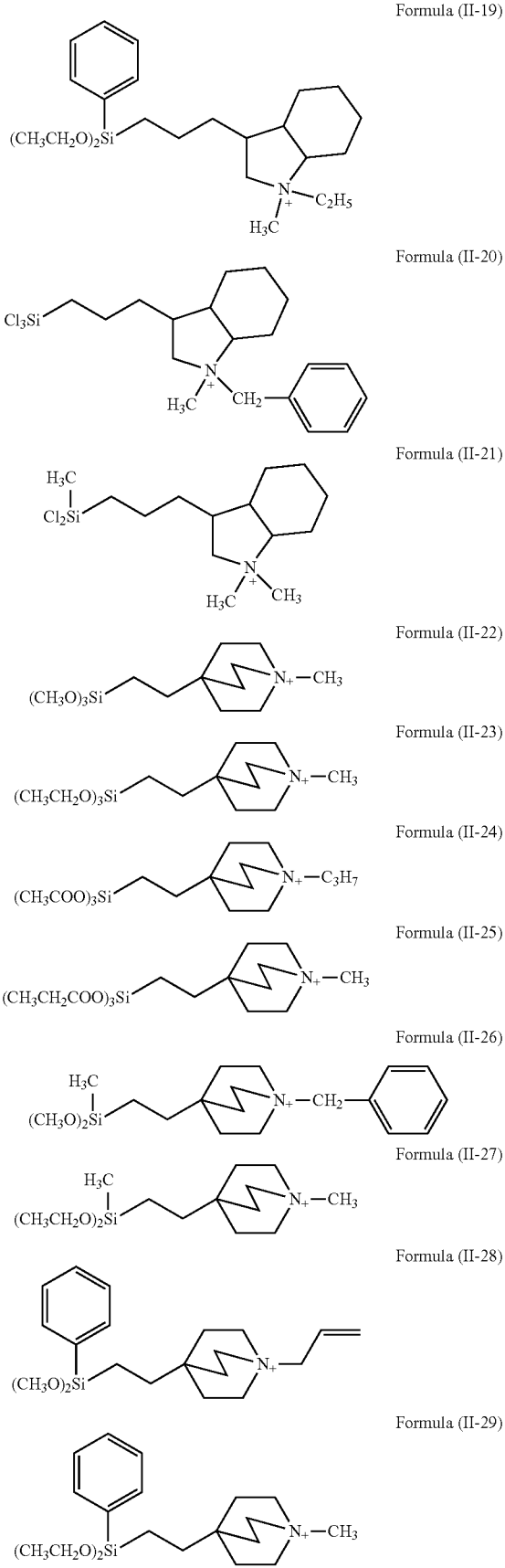

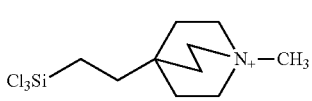

Formula (II-30)

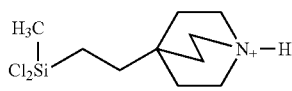

Formula (II-31)

In other examples of suitable aspects of the present invention, $R^{31}$ is a chained ammonium group represented by Formula (S3).

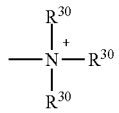

(S3)

Each of $R^{30}$ independently represents a hydrogen atom, an alkyl group, an aryl group, an aralkyl group, a halogenated alkyl group, a halogenated aryl group, a halogenated aralkyl group, or an alkenyl group, and specific examples and suitable number of carbons of the alkyl group, the aryl group, the aralkyl group, the halogenated alkyl group, the halogenated aryl group, the halogenated aralkyl group, and the alkenyl group are exemplified by the same examples and number of carbons as mentioned above.

The chained ammonium group represented by Formula (S3) bonds with a silicon atom directly, or bonds with a linking group, so that an organic group containing the chained ammonium group is formed and bonds with the silicon atom.

Such a linking group is exemplified by an alkylene group, an arylene group, or an alkenylene group, and specific examples of the alkylene group, the arylene group, and the alkenylene group are the same examples as mentioned above.

Specific examples of a hydrolyzable organosilane represented by Formula (4) having a chained ammonium group represented by Formula (S3) will be exemplified but are not limited to these.

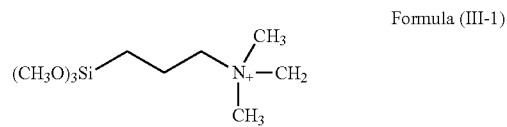

Formula (III-1)

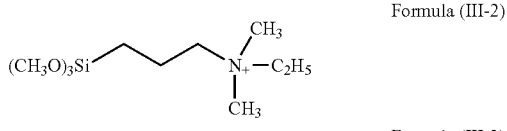

Formula (III-2)

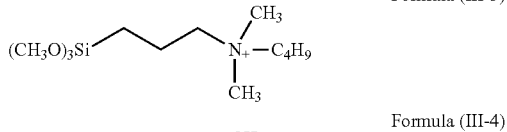

Formula (III-3)

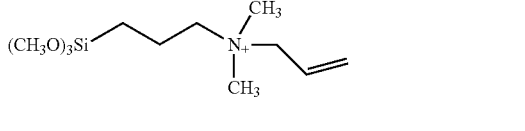

Formula (III-4)

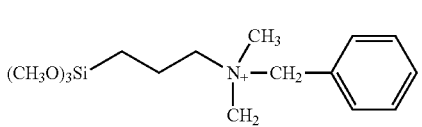

Formula (III-5)

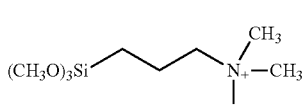

Formula (III-6)

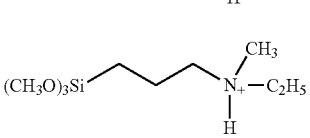

Formula (III-7)

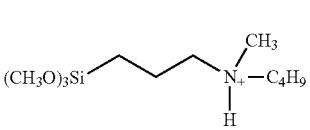

Formula (III-8)

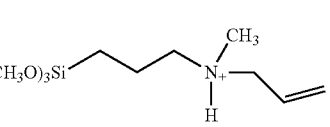

Formula (III-9)

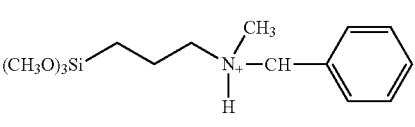

Formula (III-10)

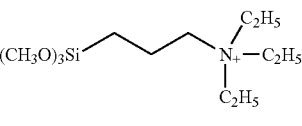

Formula (III-11)

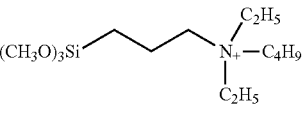

Formula (III-12)

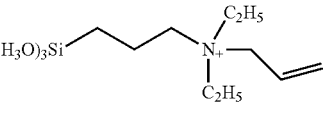

Formula (III-13)

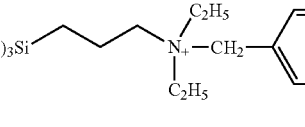

Formula (III-14)

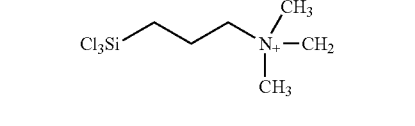

Formula (III-15)

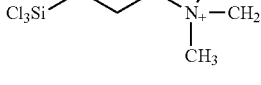

Formula (III-16)

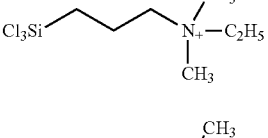

Formula (III-17)

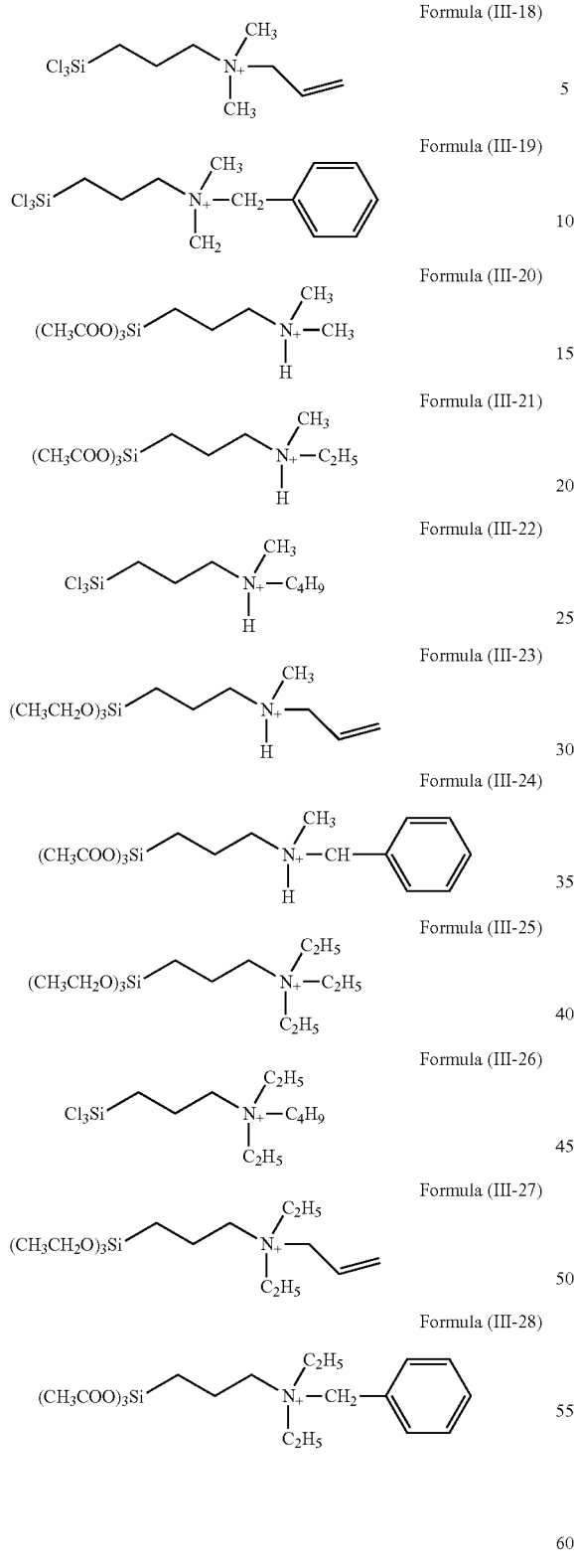
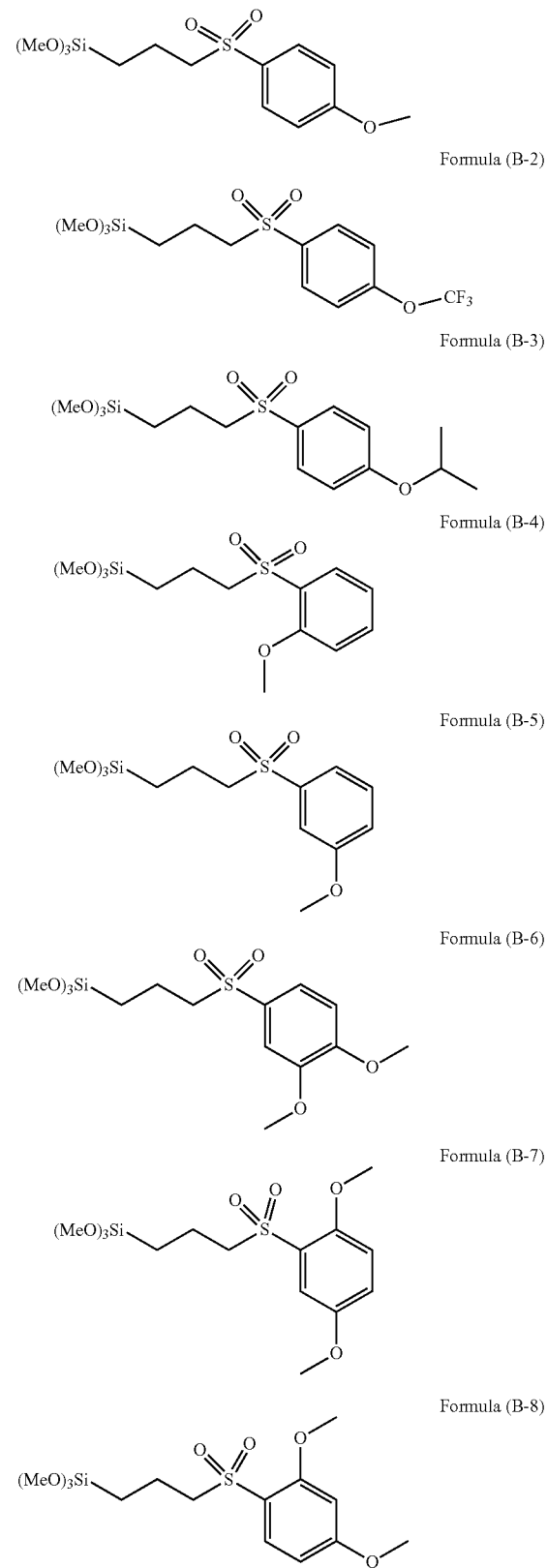
The film-forming composition according to the present invention may further include, as a hydrolyzable silane, a silane having a sulfone group or a silane having a sulfone amide group.
In the following, specific examples thereof are exemplified but are not limited to these.

Formula (B-9)
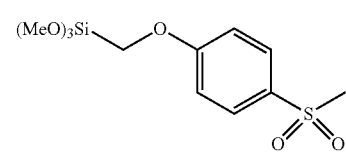
Formula (B-10)
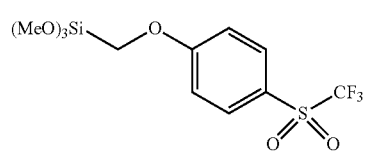
Formula (B-11)
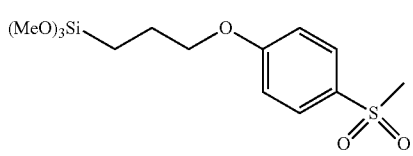
Formula (B-12)
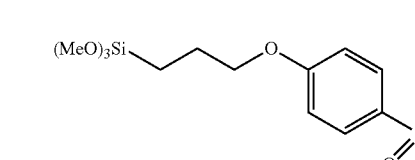
Formula (B-13)
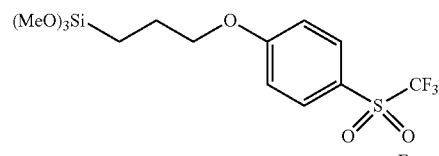
Formula (B-14)
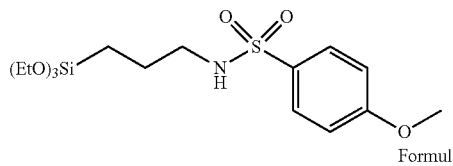
Formula (B-15)
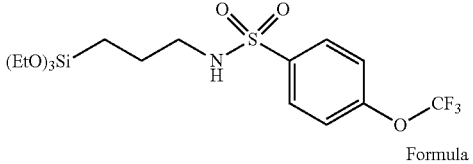
Formula (B-16)
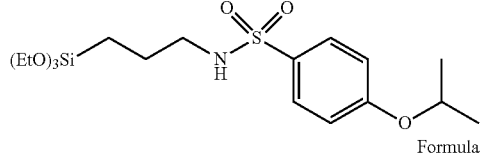
Formula (B-17)
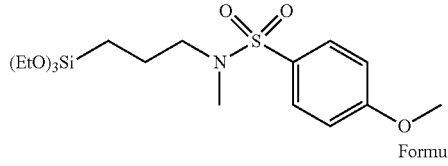
Formula (B-18)
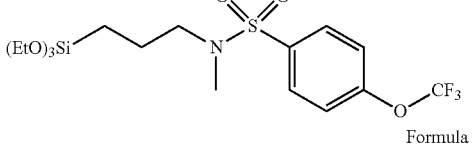
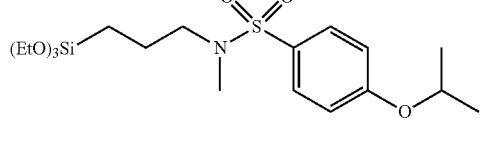
Formula (B-19)
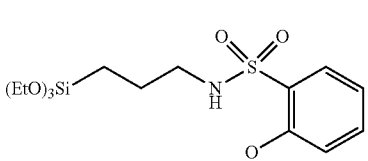
Formula (B-20)
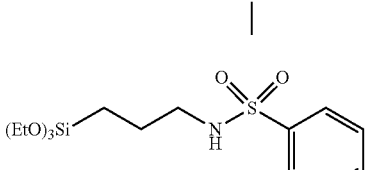
Formula (B-21)
Formula (B-22)
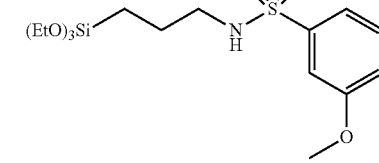
Formula (B-23)
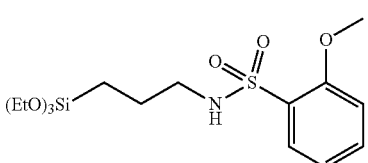
Formula (B-24)
Formula (B-25)
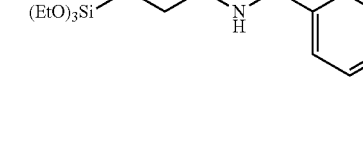

Formula (B-26)
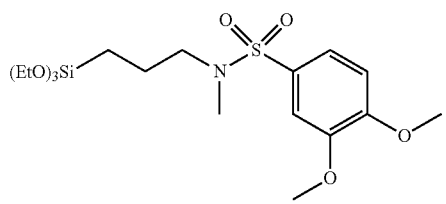

Formula (B-27)
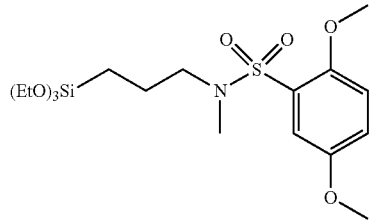

Formula (B-28)
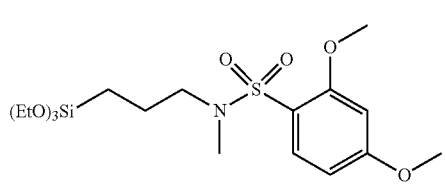

Formula (B-29)
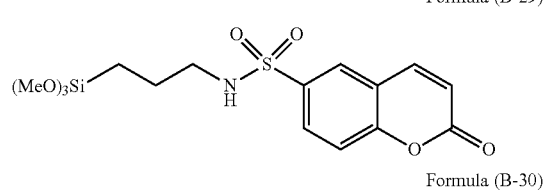

Formula (B-30)
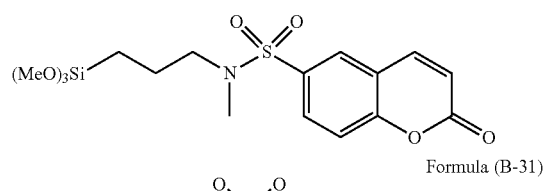

Formula (B-31)
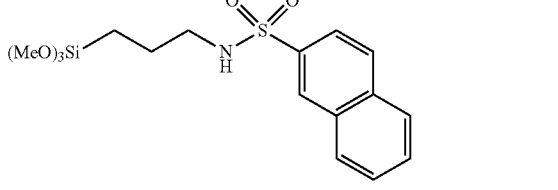

Formula (B-32)
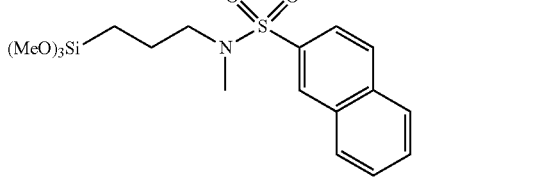

Formula (B-33)
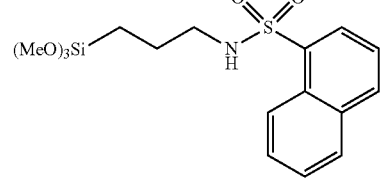

Formula (B-34)
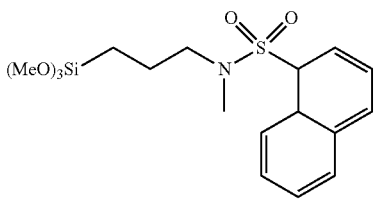

Formula (B-35)
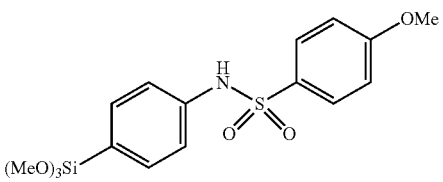

Formula (B-36)
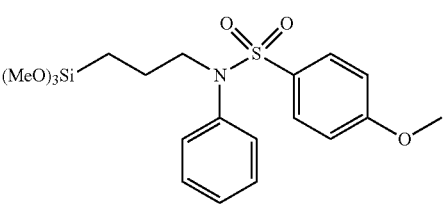

In one preferable aspect of the present invention, the film-forming composition according to the present invention includes at least a hydrolysis condensate of the hydrolyzable silane.

In one preferable aspect of the present invention, the hydrolysis condensate contained in the film-forming composition according to the present invention includes a hydrolysis condensate (polyorganosiloxane) obtainable by employing at least the crosslinkable group-containing silane represented by Formula (1) and the other silane represented by Formula (2). In a more preferable aspect of the present invention, the hydrolysis condensate contained in the film-forming composition according to the present invention is a hydrolysis condensate (polyorganosiloxane) obtainable by employing at least the crosslinkable group-containing silane represented by Formula (1) and the other silane represented by Formula (2).

A weight average molecular weight of the hydrolysis condensate (polyorganosiloxane) according to the present invention is generally 500 to 1,000,000, but for the sake of reducing precipitation and the like of the hydrolysis condensate in the composition and the like, the weight average molecular weight of the hydrolysis condensate (polyorganosiloxane) according to the present invention is preferably 500,000 or less, more preferably 250,000 or less, or further preferably 100,000 or less, and for the sake of achieving preservation stability and applicability and the like, the weight average molecular weight of the hydrolysis condensate (polyorganosiloxane) according to the present invention is preferably 700 or more, or more preferably 1,000 or more.

Note that the weight average molecular weight is a molecular weight in terms of polystyrene by GPC analysis. The GPC analysis can be performed, for example, by using a GPC device (product name: HLC-8220 GPC, available from Tosoh Corporation) with a GPC column (Product name: Shodex KF803L, KF802, KF801, available from Showa Denko K. K.), a column temperature of 40° C., tetrahydrofuran as an eluent (elution solvent), a flow amount (flow rate) of 1.0 ml/min, using polystyrene (available from Showa Denko K. K.) as a standard sample.

The film-forming composition according to the present invention may contain an organic acid, water, an alcohol or the like, for the sake of stabilizing the hydrolysis condensate thereof and the like.

Specific examples of such an organic acid containable in the film-forming composition according to the present invention for the sake of the purposes mentioned above are exemplified by oxalic acid, malonic acid, methyl malonic acid, succinic acid, maleic acid, malic acid, tartaric acid, phthalic acid, citric acid, glutaric acid, citric acid, lactic acid, salicylic acid, and the like, but are not limited to these. Among them, oxalic acid and maleic acid are preferable.

In a case where the film-forming composition according to the present invention contains an organic acid, the content thereof is 0.1% by mass to 5.0% by mass with respect to a total mass of the hydrolyzable silane, the hydrolysis product thereof, and the hydrolysis condensate thereof.

It is preferable that the alcohol containable in the film-forming composition according to the present invention for the purposes mentioned above be easily evaporable by heating after application. Specific examples thereof are exemplified by lower aliphatic alcohols such as methanol, ethanol, propanol, isopropanol, and butanol.

In a case where the film-forming composition according to the present invention contains an alcohol, the content thereof is 1 part by mass to 20 parts by mass with respect to 100 parts by mass of the composition.

The film-forming composition according to the present invention may further include an organic polymer compound, a photoacid generator, a surfactant, or the like, if necessary.

The organic polymer compound containable in the film-forming composition according to the present invention is selected from various organic polymers (polycondensation polymer and addition polymerization polymer) as appropriate according to the purposes of the addition thereof.

Specific examples thereof are exemplified by an addition polymerization polymer or a polycondensation polymer, such as a polyester, a polystyrene, a polyimide, an acrylic polymer, a methacrylic polymer, a polyvinyl ether, a phenolic novolak, a naphthol novolak, a polyether, a polyamide, or a polycarbonate.

In the present invention, an organic polymer containing an aromatic ring or a heterocyclic aromatic ring functionable as a light-absorbing site, such as a benzene ring, a naphthalene ring, an anthracene ring, a triazine ring, a quinoline ring, or a quinoxaline ring may be suitably employed in a case where such a function is necessary. Specific examples of such an organic polymer compound are exemplified by addition polymerization polymers including, as structural units, an addition-polymerizable monomer, such as benzyl acrylate, benzyl methacrylate, phenyl acrylate, naphthyl acrylate, anthryl methacrylate, anthrylmethyl methacrylate, styrene, hydroxystyrene, benzyl vinyl ether, or N-phenylmaleimide, and polycondensation polymers, such as a phenolic novolak and a naphthol novolak, but are not limited to these.

When an addition polymerization polymer is used as the organic polymer compound, the polymer compound may be either a homopolymer or a copolymer.

In the production of an addition polymerization polymer, an addition-polymerizable monomer is used, and specific examples of such addition-polymerizable monomers are exemplified by acrylic acid, methacrylic acid, an acrylate compound, a methacrylate compound, an acrylamide compound, a methacrylamide compound, a vinyl compound, a styrene compound, a maleimide compound, maleic anhydride, acrylonitrile and the like, but are not limited to these.

Specific examples of the acrylate compounds are exemplified by methyl acrylate, ethyl acrylate, normalhexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, glycidyl acrylate and the like, but are not limited to these.

Specific examples of the methacrylate compounds are exemplified by methyl methacrylate, ethyl methacrylate, normalhexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, bromophenyl methacrylate and the like, but are not limited to these.

Specific examples of the acrylamide compounds are exemplified by acrylamide, N-methylacrylamide, N-ethylacrylamide, N-benzylacrylamide, N-phenylacrylamide, N,N-dimethylacrylamide, N-anthrylacrylamide and the like, but are not limited to these.

Specific examples of the methacrylamide compounds are exemplified by methacrylamide, N-methylmethacrylamide, N-ethylmethacrylamide, N-benzylmethacrylamide, N-phenylmethacrylamide, N,N-dimethylmethacrylamide, N-anthrylacrylamide and the like, but are not limited to these.

Specific examples of the vinyl compounds are exemplified by vinyl alcohol, 2-hydroxyethyl vinyl ether, methyl vinyl ether, ethyl vinyl ether, benzyl vinyl ether, vinyl acetate, vinyltrimethoxysilane, 2-chloroethyl vinyl ether, 2-methoxyethyl vinyl ether, vinylnaphthalene, vinylanthracene and the like, but are not limited to these.

Specific examples of the styrene compounds are exemplified by styrene, hydroxy styrene, chlorostyrene, bromostyrene, methoxy styrene, cyanostyrene, acetylstyrene and the like, but are not limited to these.

Specific examples of the maleimide compounds are exemplified by maleimide, N-methylmaleimide, N-phenylmaleimide, N-cyclohexylmaleimide, N-benzylmaleimide, N-hydroxyethylmaleimide and the like, but are not limited to these.

In a case where a polycondensation polymer is employed as a polymer, such a polymer is exemplified by, for example, a polycondensationpolymer of a glycol compound and a dicarboxylic acid compound. As such a glycol compound, diethylene glycol, hexamethylene glycol, butylene glycol, and the like are exemplified. As such a dicarboxylic compound, succinic acid, adipic acid, terephthalic acid, maleic anhydride, and the like are exemplified. Moreover, for example, polyesters, polyamides, and polyimides such as polypyromellitimide, poly(p-phenylene terephthalic amide), polybutylene terephthalate, and polyethylene terephthalate are exemplified but are not limited to these.

In a case where the organic polymer compound contains a hydroxy group, the hydroxy group may react crosslinkingly with the hydrolysis condensate and the like.

A weight average molecular weight of an organic polymer compound containable in the film-forming composition according to the present invention is generally 1,000 to 1,000,000 but, for the sake of reducing precipitation in the composition and the like, is preferably 300,000 or less, more preferably 200,000 or less, or further preferably 100,000 and for the sake of sufficiently achieving an effect of the function as a polymer, is preferably 3,000 or more, more preferably 5,000 or more, or further preferably 10,000 or more.

Such an organic polymer compound may be used solely, or two or more kinds of such organic polymer compounds may be used in combination.

In a case where the film-forming composition according to the present invention contains an organic polymer compound, the content thereof cannot be clearly defined because the content is defined as appropriate in consideration of the function and the like of the organic polymer compound, the content is generally in a range of 1% by mass to 200% by mass with respect to a total amount of the hydrolyzable silane, and the hydrolysis product and the hydrolysis condensate thereof, but, for the sake of reducing precipitation of the compound and the like, is preferably 100% by mass or less, more preferably 50% by mass or less, or further preferably 30% by mass or less, and for the sake of sufficiently achieving the effect thereof and the like, is 5% by mass or more, more preferably 10% by mass or more, or further more preferably 30% by mass or more.

As an acid generator, thermal acid generator and photoacid generator are exemplified.

As the photoacid generator, onium salt compounds, sulfone imide compounds, disulfonyl diazomethane compounds and the like are exemplified but the photoacid generator is not limited to these.

Specific examples of the onium salt compounds are exemplified by iodonium salt compounds such as diphenyl iodonium hexafluorophosphate, diphenyl iodonium trifluoromethane sulphonate, diphenyl iodonium nonafluoro-normal butane sulfonate, diphenyl iodonium perfluoro-normal octane sulfonate, diphenyl iodonium camphorsulfonate, bis(4-t-butyl phenyl)iodonium camphorsulfonate, and bis(4-t-butyl phenyl)iodonium trifluoromethane sulfonate, sulfonium salt compounds such as triphenyl sulfonium hexafluoro antimonate, triphenyl sulphonium nonafluoro-normal butane sulfonate, triphenyl sulfonium camphorsulfonate, triphenyl sulfonium trifluoromethane sulfonate, and the like, but are not limited to these.

Specific examples of the sulfone imide compound are exemplified by N-(trifluoromethane sulfonyloxy) succinimide, N-(nonafluoro-normal butane sulfonyloxy) succinimide, N-(camphorsulfonyloxy) succinimide, N-(trifluoromethane sulfonyloxy) naphthal imide and the like, but are not limited to these.

Specific examples of the disulfonyl diazomethane compound are exemplified by bis(trifluoromethyl sulfonyl) diazomethane, bis(cyclohexyl sulfonyl) diazomethane, bis(phenyl sulfonyl) diazomethane, bis(p-toluene sulfonyl) diazomethane, bis(2,4-dimethyl benzene sulfonyl) diazomethane, methyl sulfonyl-p-toluene sulfonyl diazomethane, and the like, but are not limited to these.

The acid generator may be used solely or two or more kinds of the acid generators may be used in combination.

In a case where the film-forming composition according to the present invention contains an acid generator, the content thereof cannot be clearly defined because the content is defined as appropriate in consideration of the kind of the acid generator and the like, the content thereof is generally in a range of 0.01% by mass to 5% by mass with respect to the total mass of the hydrolyzable silane, the hydrolysis product thereof, and the hydrolysis condensate thereof, and for the sake of reducing precipitation of the acid generator in the composition and the like, the content thereof is preferably 3% by mass or less, or more preferably 1% by mass or less, and for the sake of sufficiently achieving the effect and the like, the content is preferably 0.1% by mass or more, or more preferably 0.5% by mass or more.

The surfactant is effective especially for reducing generations of pinholes, striations, and the like in applying the film-forming composition according to the present invention on a substrate as a resist underlayer film-forming composition for lithography.

Specific examples of such a surfactant are exemplified by nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as product name: EFTOP EF301, EF303, EF352 (available from TOHKEM PRODUCTS Corporation), product name: MEGAFAC F171, F173, R-08, R-30, R-30N, R-40LM (available from DIC Corporation), Fluorad FC430, FC431 (available from Sumitomo 3M Japan Limited), and product name: AsahiGuard AG710, Surflon S-382, SC101, SC102, SC103, SC104, SC105, SC106 (available from AGC, Inc.), and organosiloxane polymer KP341 (available from Shin-Etsu Chemical Co., Ltd.), but are not limited to these.

The surfactant may be used solely or two or more kinds of the surfactant may be used in combination.

In a case where the film-forming composition according to the present invention contains a surfactant, the content thereof is generally in a range of 0.0001 parts by mass to 5 parts by mass with respect to 100 parts by mass of the condensate (polyorganosiloxane), but for the sake of reducing precipitation in the composition and the like, the content is preferably 1 part by mass or less, and for the sake of achieving sufficient the effect thereof and the like, the content is preferably 0.001 parts by mass or more, or more preferably 0.01 parts by mass or more.

Furthermore, the film-forming composition according to the present invention may contain a rheology adjusting agent, an adhesive auxiliary agent, or the like. The rheology adjusting agent is effective for improving flowability of the film-forming composition. The adhesive auxiliary agent is effective for improving adhesivity between the resist underlayer film obtainable from the composition according to the present invention and a semiconductor substrate or a resist.

The hydrolysis product or the hydrolysis condensate used in the present invention is obtainable by hydrolysis of the hydrolyzable silane.

The hydrolysis may be full hydrolysis or partial hydrolysis. As described above, the hydrolysis condensate contained in the film-forming composition according to the present invention may contain a partial hydrolysis product together with a full hydrolysis product. Moreover, the hydrolyzable silane, which is a monomer, may remain in the composition.

The hydrolyzable silane used in the present invention has an alkoxy group, an aralkyloxy group, an acyloxy group, or a halogen atom directly bonding to the silicon atom, and contains a hydrolyzable group, which is an alkoxy silyl group, an aralkyloxy silyl group, an acyloxy silyl group, or a halogenated silyl group, and the hydrolysis thereof is carried out generally with water of 0.5 mol to 100 mol, or preferably with water of 1 mol to 10 mol per 1 mol of the hydrolyzable group.

In performing the hydrolysis, a hydrolysis catalyst may be used for the sake of facilitating the hydrolysis and the like. Specific examples thereof are exemplified by a metal chelate compound, an organic acid, an inorganic acid, an organic base, an inorganic base, and the like, but are not limited to these.

The hydrolysis catalyst may be used solely or two or more kinds of the hydrolysis catalysts may be used in combination. An amount thereof to be used is generally 0.001 mol to 10 mol, or preferably 0.001 mol to 1 mol per 1 mol of the hydrolyzable group.

Specific examples of the metal chelate compound are exemplified by a titanium chelate compound such as triethoxy mono(acetylacetonate)titanium, tri-n-propoxy mono(acetylacetonate)titanium, tri-i-propoxy mono(acetylacetonate)titanium, tri-n-butoxy mono(acetylacetonate)titanium, tri-sec-butoxy mono(acetylacetonate)titanium, tri-t-butoxy mono(acetylacetonate)titanium, diethoxy bis(acetylacetonate)titanium, di-n-propoxy bis(acetylacetonate)titanium, di-i-propoxy bis(acetylacetonate)titanium, di-n-butoxy bis(acetylacetonate)titanium, di-sec-butoxy bis(acetylacetonate)titanium, di-t-butoxy bis(acetylacetonate)titanium, monoethoxy tris(acetylacetonate)titanium, mono-n-propoxy tris(acetylacetonate)titanium, mono-i-propoxy tris(acetylacetonate)titanium, mono-n-butoxy tris(acetylacetonate)titanium, mono-sec-butoxy tris(acetylacetonate)titanium, mono-t-butoxy tris(acetylacetonate)titanium, tetrakis(acetylacetonate)titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy bis(ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate)titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, or tris(acetylacetonate)mono(ethylacetoacetate)titanium; a zirconium chelate compound such as triethoxy mono(acetylacetonate)zirconium, tri-n-propoxy mono(acetylacetonate)zirconium, tri-i-propoxy mono(acetylacetonate)zirconium, tri-n-butoxy mono(acetylacetonate)zirconium, tri-sec-butoxy mono(acetylacetonate)zirconium, tri-t-butoxy mono(acetylacetonate)zirconium, diethoxy bis(acetylacetonate)zirconium, di-n-propoxy bis(acetylacetonate)zirconium, di-i-propoxy bis(acetylacetonate)zirconium, di-n-butoxy bis(acetylacetonate)zirconium, di-sec-butoxy bis(acetylacetonate)zirconium, di-t-butoxy bis(acetylacetonate)zirconium, monoethoxy tris(acetylacetonate)zirconium, mono-n-propoxy tris(acetylacetonate)zirconium, mono-i-propoxy tris(acetylacetonate)zirconium, mono-n-butoxy tris(acetylacetonate)zirconium, mono-sec-butoxy tris(acetylacetonate)zirconium, mono-t-butoxy tris(acetylacetonate)zirconium, tetrakis(acetylacetonate)zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono(ethylacetoacetate)zirconium, tri-sec-butoxy mono(ethylacetoacetate)zirconium, tri-t-butoxy mono(ethylacetoacetate)zirconium, diethoxy bis(ethylacetoacetate)zirconium, di-n-propoxy bis(ethylacetoacetate)zirconium, di-i-propoxy bis(ethylacetoacetate)zirconium, di-n-butoxy bis(ethylacetoacetate)zirconium, di-sec-butoxy bis(ethylacetoacetate)zirconium, di-t-butoxy bis(ethylacetoacetate)zirconium, monoethoxy tris(ethylacetoacetate)zirconium, mono-n-propoxy tris(ethylacetoacetate)zirconium, mono-i-propoxy tris(ethylacetoacetate)zirconium, mono-n-butoxy tris(ethylacetoacetate)zirconium, mono-sec-butoxy tris(ethylacetoacetate)zirconium, mono-t-butoxy tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, or tris(acetylacetonate)mono(ethylacetoacetate)zirconium; and an aluminum chelate compound such as tris(acetylacetonate)aluminum, or tris(ethylacetoacetate)aluminum, and the like, but are not limited to these.

Specific examples of the organic acid are exemplified by acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and the like, but are not limited to these.

Specific examples of the inorganic acid are exemplified by hydrochloric acid, nitric acid, sulfuric acid, fluoric acid, phosphoric acid, and the like, but are not limited to these.

Specific examples of the organic base are exemplified by pyridine, pyrrole, piperazine, pyrrolidine, piperidine, picoline, trimethyl amine, triethyl amine, monoethanol amine, diethanol amine, dimethyl monoethanol amine, monomethyl diethanol amine, triethanol amine, diazabicyclooctane, diazabicyclononane, diazabicycloundecene, tetramethyl ammonium hydroxide, tetraethyl ammonium hydroxide, tetrapropyl ammonium hydroxide, tetrabutyl ammonium hydroxide, trimethyl phenyl ammonium hydroxide, benzyl trimethyl ammonium hydroxide, benzyl triethyl ammonium hydroxide, and the like, but are not limited to these.

Specific examples of the inorganic base are exemplified by ammonia, sodium hydroxide, potassium hydroxide, barium hydroxide, calcium hydroxide, and the like, but are not limited to these.

Among them, the metal chelate compound, the organic acid, and the inorganic acid are preferable as the hydrolysis catalyst.

An organic solvent may be used in the hydrolysis as the solvent, and specific examples of the organic solvent are exemplified by an aliphatic hydrocarbon-based solvent such as n-pentane, isopentane, n-hexane, isohexane, n-heptane, isoheptane, 2,2,4-trimethylpentane, n-octane, isooctane, cyclohexane or methylcyclohexane; an aromatic hydrocarbon-based solvent such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene or trimethylbenzene; a monoalcohol-based solvent such as methanol, ethanol, n-propanol, isopropanol, n-butanol, isobutanol, s-butanol, t-butanol, n-pentanol, isopentanol, 2-methylbutanol, s-pentanol, t-pentanol, 3-methoxybutanol, n-hexanol, 2-methylpentanol, s-hexanol, 2-ethylbutanol, s-heptanol, heptanol-3, n-octanol, 2-ethylhexanol, s-octanol, n-nonyl alcohol, 2,6-dimethylheptanol-4, n-decanol, s-undecyl alcohol, trimethylnonyl alcohol, s-tetradecyl alcohol, s-heptadecyl alcohol, phenol, cyclohexanol, methylcyclohexanol, 3,3,5-trimethylcyclohexanol, benzyl alcohol, phenyl methyl carbinol, diacetone alcohol or cresol; a polyhydric alcohol-based solvent such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol or glycerin; a ketone-based solvent such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethyl nonanone, cyclohexanone, methylcyclohexanone, 2,4-pentanedione, acetonylacetone, diacetone alcohol, acetophenone or fenchone; an ether-based solvent such as ethyl ether, isopropyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran or 2-methyltetrahydrofuran; an ester-based solvent such as diethyl carbonate, methyl acetate, ethyl acetate, γ-butyrolactone, γ-valerolactone, n-propyl acetate, isopropyl acetate, n-butyl acetate, isobutyl acetate, s-butyl acetate, n-pentyl acetate, s-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate or diethyl phthalate; a nitrogen-containing solvent such as N-methylformamide, N,N-dimethylformamide, N,N-diethylformamide, acetamide, N-methylacetamide, N,N-dimethylacetamide, N-methylpropionamide or N-methylpyrrolidone; and a sulfur-containing solvent such as dimethyl sulfide, diethyl sulfide, thiophene, tetrahydrothiophene, dimethyl sulfoxide, sulfolane or 1,3-propane sultone; and the like, but are not limited to these. These solvents may be used solely or two or more kinds of the solvents may be used in combination.

Among them, ketone-type solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethyl nonane, cyclohexanone, methyl cyclohexanone, 2,4-pentanedione, acetonyl acetone, diacetone alcohol, acetophenone, and fenchone are preferable for the sake of preservation stability of the solution.

Moreover, as a pH adjuster, a bisphenol S or a bisphenol S derivative may be added. The bisphenol S or the bisphenol S derivative is 0.01 parts by mass to 20 parts by mass or 0.01 parts by mass to 10 parts by mass, or 0.01 parts by mass to 5 parts by mass with respect to 100 parts by mass of polyorganosiloxane.

In the following, specific examples of bisphenol S and bisphenol S derivative are exemplified, but are not limited to these.

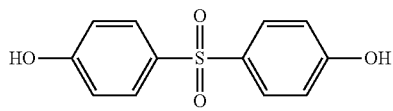

Formula (C-1)

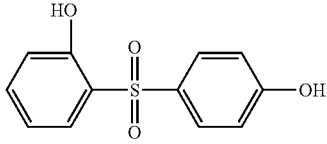

Formula (C-2)

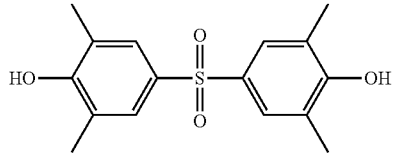

Formula (C-3)

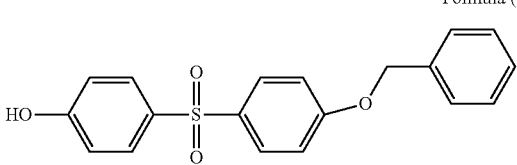

Formula (C-4)

Formula (C-5)
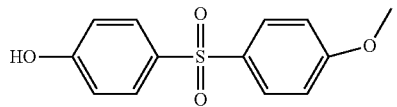

Formula (C-6)
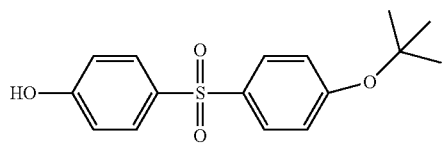

Formula (C-7)
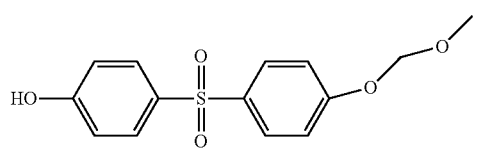

Formula (C-8)
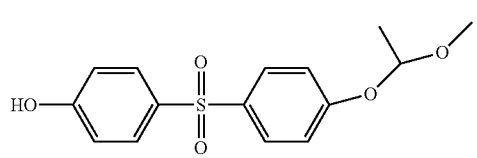

Formula (C-9)
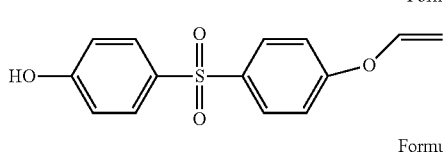

Formula (C-10)
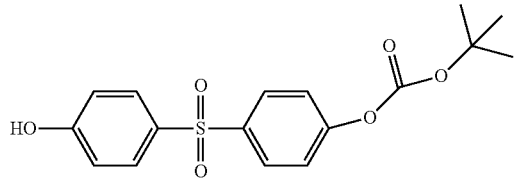

Formula (C-11)
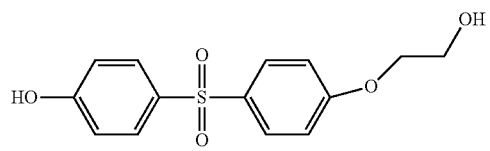

Formula (C-12)
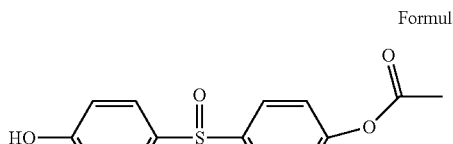

Formula (C-13)
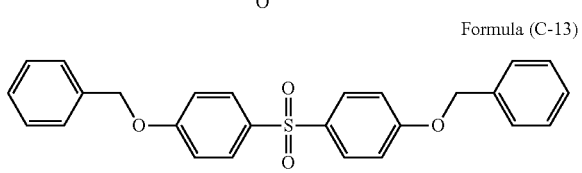

Formula (C-14)
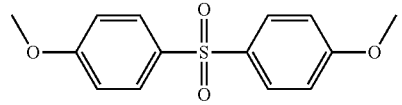

Formula (C-15)
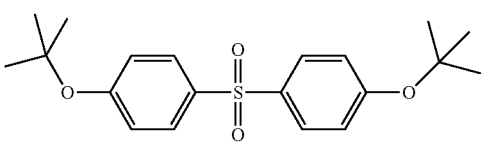

Formula (C-16)
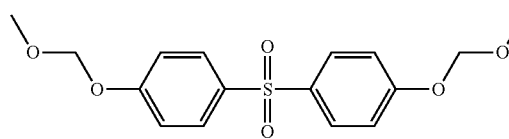

Formula (C-17)
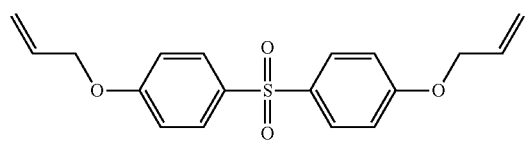

Formula (C-18)
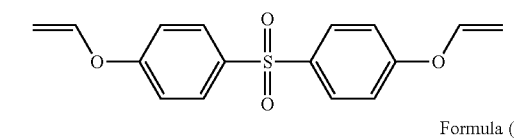

Formula (C-19)
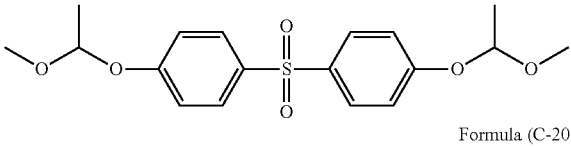

Formula (C-20)
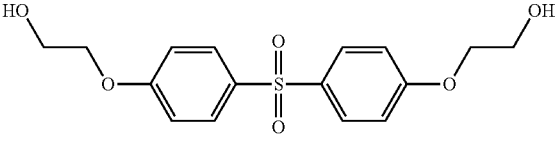

Formula (C-21)
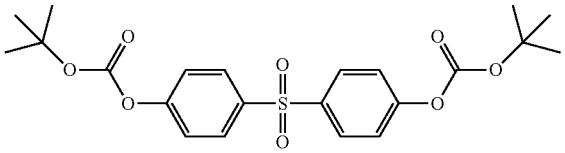

Formula (C-22)
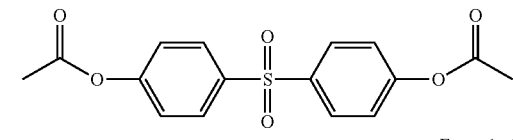

Formula (C-23)
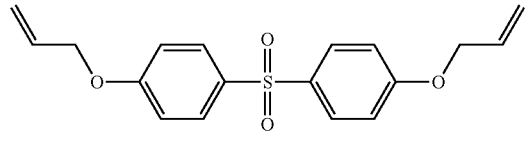

A reaction temperature of the hydrolysis and the fusion is generally 20° C. to 80° C.

In a case where a silane other than the crosslinkable group-containing silane represented by Formula (1) is employed as the hydrolyzable silane, a feeding amount of the crosslinkable group-containing silane represented by Formula (1) is generally 0.1 mol % or more in the whole hydrolyzable silane. For the sake of achieving the effect of the present invention with a high reproducibility, the feeding amount of the crosslinking group-containing silane represented by Formula (1) is preferably 0.5 mol % or more, more preferably 1 mol % or more, or further preferably 5 mol % or more.

In a case where the other silane represented by Formula (2) or the other silane represented by Formula (3) is employed as the hydrolyzable silane, the feeding amount of these silanes is generally 0.1 mol % or more, preferably 1 mol % or more, or further preferably 5 mol % or more, and generally 99.9 mol % or less, preferably 99 mol % or less, or more preferably 95 mol % or less in the whole hydrolyzable silane.

In a case where the hydrolyzable organosilane represented by Formula (4) is employed as the hydrolyzable silane, the feeding amount of the organosilane is generally 0.01 mol % or more, or preferably 0.1 mol % or more, and generally 30 mol % or less or preferably 10 mol % or less in the whole hydrolyzable silane.

By hydrolyzing the hydrolyzable silane under the conditions explained above, the hydrolysis product or the hydrolysis condensate can be produced.

After the reaction, the acid or base catalyst used for the hydrolysis can be removed by treating, with neutralization or with an ion-exchanging resin, a reaction solution as such, or the reaction solution diluted or concentrated. Moreover, before or after such treatment, a byproduct such as alcohol, water, the catalyst, or the like may be removed from the reaction solution by distillation under reduced pressure or the like.

If necessary, after such purification, the solvent may be distilled off wholly or partially from the solution containing the hydrolysis condensate, so as to obtain the hydrolysis condensate as a solid or as a solution containing the hydrolysis condensate.

The film-forming composition according to the present invention can be produced by mixing the hydrolyzable silane, the hydrolysis product thereof, and/or the hydrolysis condensate thereof with a solvent and, if another component is to be contained, with the other component. This mixing may be such that a solution containing the hydrolysis condensate and/or the like is prepared in advance and the solution is mixed with the solvent and the other component.

The order of mixing-in is not particularly limited. For example, the mixing-in may be such that the solvent is added and mixed into the solution containing the hydrolysis condensate and/or the like and the other component is added in a mixture thus prepared, or that the solution containing the hydrolysis condensate and/or the like, the solvent, and the other component are mixed together at the same time.

If necessary, the solvent may be further added or a component relatively easily soluble in the solvent among the components may be not contained in the mixture, so that the component relatively easily soluble in the solvent is added at the end. However, for the sake of reproducibly preparing the composition with excellent uniformity by reducing aggregation or separation of the constituent components, it is preferable that a solution in which the hydrolysis condensate and the like are well dissolved be prepared in advance and the composition be prepared by using the solution. Note that it is advisable to pay attention to possibility that the hydrolysis condensate and the like would be possibly aggregated or precipitated in mixing the hydrolysis condensate and the like, depending on the kind and amount of the solvent to be mixed with the hydrolysis condensate and the like and on the amount, property, and the like of the other component to be mixed with the hydrolysis condensate and the like. Moreover, in a case where the composition is prepared by using such a solution in which the hydrolysis condensate and the like are dissolved, it is advisable to pay attention to a need that concentration and an amount of the solution of the hydrolysis condensate and the like should be determined in such a way that a desired amount of the hydrolysis condensate and the like will be contained in the composition finally obtained.

At the stage of preparation, the composition may be heated as appropriate, as long as the components are not decomposed or denatured.

In the present invention, the film-forming composition may be filtered with a filter of sub-micro meter order or the like at a stage during the preparation of the composition or after all of the components are mixed.

Concentration of the solid content in the film-forming composition according to the present invention is generally 0.1% by mass to 50% by mass with respect to the mass of the composition, but for the sake of reducing precipitation of the solid content, the concentration of the solid content is preferably 30% by mass or less, or more preferably 25% by mass or less.

A total ratio of the hydrolyzable silane, the hydrolysis product thereof, and the hydrolysis condensate thereof in the solid content is generally 50% by mass or more, preferably 60% by mass or more, more preferably 70% by mass or more, further preferably 80% by mass or more, or still further preferably 90% by mass or more, for the sake of achieving the effect of the present invention with a good reproducibility.

The film-forming composition according to the present invention is applicable as a resist underlayer film-forming composition used for a lithography process.

According to one aspect of the present invention, a resist underlayer film-forming composition including the film-forming composition according to the present invention is applied on a substrate used for production of a semiconductor device (for example, such as a silicon wafer substrate, a silicon/silicon dioxide coated substrate, a silicon nitride substrate, a glass substrate, an ITO substrate, a polyimide substrate, and a low-k material-coated substrate) by an appropriate application method such as a spinner and a coater, and after that, the resist underlayer film-forming composition is baked, so as to form a resist underlayer film according to the present invention.

Baking conditions are generally appropriately selected from baking temperatures of 80° C. to 250° C. and baking times of 0.3 min to 60 min. The baking conditions are preferably with a baking temperature of 150° C. to 250° C. and a baking time of 0.5 min to 2 min.

A film thickness of the resist underlayer film according to the present invention is, for example, 10 nm to 1,000 nm, or 20 nm to 500 nm, or 50 nm to 300 nm, or 100 nm to 200 nm.

Next, on the resist underlayer film according to the present invention, for example, a photoresist layer is formed. The formation of the photoresist layer may be carried out by a well-known method, that is, by applying a photoresist composition on the resist underlayer film according to the present invention, and baking the photoresist composition. A film thickness of the photoresist is, for example, 50 nm to 10,000 nm, or 100 nm to 2,000 nm, or 200 nm to 1,000 nm.

In another aspect according to the present invention, after the formation of an organic underlayer film on a substrate, a resist underlayer film according to the present invention may be formed on the organic underlayer film, and a photoresist layer may be formed on the resist underlayer film. In this way, a pattern width of the photoresist becomes narrower, so that processing of the substrate can be possible by selecting an appropriate etching gas, even if coating of the photoresist is thin in order to prevent pattern collapse. For example, in a case where the etching gas is fluorine-based gas, which achieves a sufficiently fast etching rate with respect to the photoresist, the processing of the resist underlayer film according to the present invention becomes possible. Moreover, in a case where the etching gas is oxygen-based gas, which achieves a sufficiently fast etching rate with respect to the resist underlayer film according to the present invention, the processing of the organic underlayer film becomes possible. Furthermore, in a case where the etching gas is fluorine-based gas, which achieves a sufficiently fast etching rate with respect to the organic underlayer film, the processing of the substrate becomes possible.

The photoresist to be formed on the resist underlayer film according to the present invention is not particularly limited as long as the photoresist is sensitive to light used for light exposure. Either negative-type photoresists or positive-type photoresists are usable, and specific examples thereof are exemplified by a positive-type photoresist including novolak resin and 1,2-naphthoquinone diazide sulfonic acid ester, a chemically amplified photoresist including a photoacid generator and a binder having a group that is decomposed with an acid so as to increase an alkali dissolving rate, a chemically amplified photoresist including an alkali soluble binder, a photoacid generator, and a low-molecular weight compound that is decompound with an acid so as to increase an alkali dissolving rate of a photoresist, a chemically amplified photoresist including a photoacid generator, a binder having a group that is decomposed with an acid so as to increase an alkali dissolving rate, and a low-molecular weight compound that is decompound with an acid so as to increase an alkali dissolving rate of a photoresist, and the like, but are not limited to these.

Specific examples commercially available are exemplified by product name: APEX-E available from Shipley Company L. L. C., product name: PAR710 available from Sumitomo Chemical Co., Ltd., product name: SEPR430 available from Shin-Etsu Chemical Co., Ltd., and the like, but are not limited to these.

Moreover, for example, fluorine atom-containing polymer-based photoresists such as those described in Proc. SPIE, Vol. 3999, 330-334(2000), Proc. SPIE, Vol. 3999, 357-364(2000), and Proc. SPIE, Vol. 3999, 365-374(2000) can be suitably used.

Next, light exposure via a predetermined mask is performed. For the light exposure, KrF excimer laser (wavelength 248 nm), ArF excimer laser (wavelength 193 nm), F2 excimer laser (wavelength 157 nm) or the like may be used.

After the light exposure, post-exposure bake may be carried out, if necessary. The post-exposure bake is carried out under conditions appropriately selected from heating temperatures of 70° C. to 150° C. and heating times of 0.3 min to 10 min.

In the present invention, as a resist, instead of the photoresist, a resist for electron-beam lithography or a resist for EUV lithography may be used.

As the resist for electron-beam lithography, either negative types or positive types can be used, and specific examples thereof are exemplified by a chemically amplified resist including an acid generator and a binder having a group that is decomposed with an acid so as to change an alkali dissolving rate, a chemically amplified resist including an alkali soluble binder, an acid generator, and a low-molecular weight compound that is decomposed with an acid so as to change an alkali dissolving rate of the resist, a chemically amplified resist including an acid generator, a binder having a group that is decomposed with an acid so as to change an alkali dissolving rate, and a low-molecular weight compound that is decomposed with an acid so as to change an alkali dissolving rate of the resist, a non-chemically amplified resist including a binder having a group that is decomposed with an electron beam so as to change an alkali dissolving rate, a non-chemically amplified resist including a binder having a site that is cleaved with an electron beam so as to change an alkali dissolving rate, and the like, but are not limited to these. Even in a case of use of these resists for electron-beam lithography, a resist pattern can be formed with the electron beam as a radiation source, like in a case where the photoresist is used.

As the resist for EUV lithography, a methacrylate resin-type resist can be used.

Subsequently, the development is performed using a developer (an alkali developer, for example). Thus, if, for example, a positive photoresist is used, an exposed portion of the photoresist is removed, resulting in forming a pattern of the photoresist.

Specific examples of the developer are exemplified by alkaline aqueous solutions such as an aqueous solution of an alkali metal hydroxide such as potassium hydroxide or sodium hydroxide, an aqueous solution of a quaternary ammonium hydroxide such as tetramethylammonium hydroxide, tetraethylammonium hydroxide or choline, and an amine aqueous solution of ethanolamine, propylamine, ethylenediamine or the like, but are not limited to these.

An organic solvent can be used as the developer in the present invention. That is, the development is performed using a developer (an organic solvent) after the exposure. Thus, if, for example, a positive photoresist is used, an unexposed portion of the photoresist is removed, resulting in forming a pattern of the photoresist.

Specific examples of the organic solvent that can be used as such developer are exemplified by methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3- ethoxypropionate, propyl-3-methoxypropionate and the like, but are not limited to these.

If necessary, a developer may include a surfactant or the like.

The development is performed under conditions appropriately selected from temperatures of 5° C. to 50° C. and times of 10 seconds to 600 seconds.

After that, the resist underlayer film (intermediate layer) according to the present invention is removed, using a pattern of the photoresist (upper layer) thus formed as a protective film, and then an organic underlayer film (lower layer) is removed, using a film including the photoresist and the resist underlayer film (intermediate layer) according to the present invention thus patterned as a protective film. Finally, a semiconductor substrate is processed, using the resist underlayer film (intermediate layer) according to the present invention and the organic underlayer film (lower layer) thus patterned as protective films.

To begin with, a photoresist-removed portion of the resist underlayer film (intermediate layer) according to the present invention is removed with dry etching, so as to expose the semiconductor substrate.

For the dry etching of the resist underlayer film of the present invention, a gas such as tetrafluoromethane ($CF_4$), perfluorocyclo butane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane can be used.

It is preferable to use a halogen-based gas for the dry etching of the resist underlayer film. In the dry etching with a halogen-based gas, a photoresist formed from an organic material is basically difficult to be removed. On the other hand, the resist underlayer film according to the present invention containing a large amount of silicon atoms can be readily removed with such a halogen-based gas. Therefore, the resist underlayer film according to the present invention makes it possible to reduce reduction of the film thickness of the photoresist, which would occur in association with the dry etching of the resist underlayer film. Therefore, it becomes possible to use the photoresist as a thin film. It is preferable that the dry etching of the resist underlayer film be performed with a fluorine-based gas, and for example, the fluorine-based gas is exemplified by tetrafluoromethane ($CF_4$), perfluorocyclo butane ($C_4F_8$), perfluoropropane ($C_3F_8$), trifluoromethane, difluoro methane ($CH_2F_2$), and the like, but is not limited to these.

After that, the removal of the organic underlayer film is carried out, using, as a protective film, a film formed from the photoresist and the resist underlayer film according to the present invention thus patterned. It is preferable that the organic underlayer film (lower layer) be performed by dry etching with an oxygen-based gas. This is because the resist underlayer film according to the present invention containing a large amount of silicon atoms is difficult to be removed by dry etching with the oxygen-based gas.

Finally, the processing of the semiconductor substrate is performed. It is preferable that the processing of the semiconductor substrate be performed by dry etching with a fluorine-based gas.

For example, the fluorine-based gas is exemplified by tetrafluoromethane ($CF_4$), perfluorocyclo butane ($C_4F_8$), perfluoropropane ($C_3F_8$), trifluoromethane, difluoro methane ($CH_2F_2$), and the like, but is not limited to these.

As an upper layer on the resist underlayer film according to the present invention, an organic reflection preventing film may be formed before the formation of the photoresist.

A reflection preventing film composition used therein is not particularly limited, and for example a material used may be selected arbitrarily from those that have been widely used in lithography processes, and the formation of the reflection preventing film may be carried out by a widely-used method, for example by applying with a spinner or a coater, and baking.

The substrate on which the resist underlayer film-forming composition including the film-forming composition according to the present invention is to be applied may be a substrate on a surface of which an organic or inorganic reflection preventing film formed by a CVD method or the like is provided. The resist underlayer film according to the present invention may be formed thereon.

The resist underlayer film formed from the resist underlayer film-forming composition according to the present invention would possibly have a property of absorbing light used in the lithography process, depending on a wavelength of the light. In addition, in such a case, the resist underlayer film can function as a reflection preventing film having an effect of preventing reflection light from the substrate. Furthermore, the resist underlayer film according to the present invention can be used as a layer for preventing interaction between the substrate and the photoresist, a layer having a function of preventing the material used for the photoresist or a material generated when performing the light exposure of the photoresist from adversely affecting the substrate, a layer having a function of preventing diffusion of a material generated from the substrate at the thermal baking into an upper-layer photoresist, a barrier layer for reducing the poisoning effect of the photoresist layer by a semiconductor substrate dielectric layer, and the like.

The resist underlayer film formed from the resist underlayer film-forming composition according to the present invention is applicable to a substrate on which via holes for use in a dual damascene process are formed, so that the resist underlayer film is used as a hole-filling material (filler material) that can fill the holes without gaps. Moreover, the resist underlayer film may be used as a flattening material for flattening a surface of a semiconductor substrate having convexes and concaves.

As an underlayer film for the EUV resist, the resist underlayer film according to the present invention can be used for the following purposes other than a function as a hard mask. The resist underlayer film-forming composition can be used for an underlayer reflection preventing film for the EUV resist, which does not intermix with the EUV resist and can prevent exposure light not preferable for EUV exposure, for example, the aforementioned deep ultraviolet (DUV) light from reflecting from the substrate or an interface. By being provided under the EUV resist, the underlayer reflection preventing film can prevent the reflection effectively. In a case where the resist underlayer film-forming composition is used for an EUV resist underlayer film, the process therefor may be similarly carried out as for the underlayer film for the photoresist.

EXAMPLES

In the following, the present invention will be described in more detail, referring to Synthesis Examples and Examples, but the present invention is not limited to these.

[1] Synthesis of 3-(methoxy methyl)-1-(3-(triethoxy silyl) propyl) imidazolidine-2,4-dione (MOMHDITEOS)

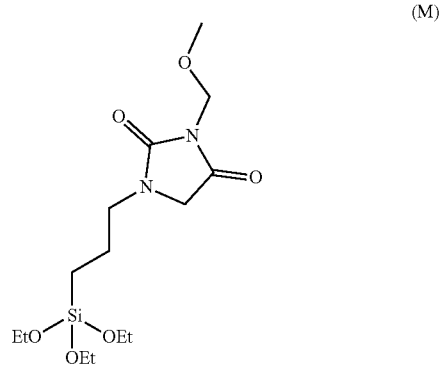 [SMILES: CCO[Si](CCCN1CC(=O)N(COC)C1=O)(OCC)OCC]

(M)

50.00 g of 1-allylhydantoin (available from Tokyo Chemical Industry Co., Ltd.), 147.92 g of potassium carbonate (available from Kanto Chemical Co., Inc.), 500.00 g of N,N-dimethyl formamide were fed in and stirred at 40° C. for 30 min. After the stirring, the mixture was cooled down to 0° C. to 5° C., and 86.17 g of chloromethyl methyl ether (available from Tokyo Chemical Industry Co., Ltd.) was dropped at <10° C. After the dropping, the mixture was heated to 20° C. to 30° C., and 28.72 g of chloromethyl methyl ether (available from Tokyo Chemical Industry Co., Ltd.) was further dropped at <10° C. 1000.00 g of ethyl acetate was added therein and the mixture was filtered. 500.00 g of water was added and liquid separation was carried out. An organic layer thus separated was washed twice with 500.00 g of water. The organic layer thus obtained was concentrated, thereby obtaining 54.94 g of 1-allyl-3-methoxy methyl hydantoin with a yield of 41.8%.

36.13 g of 1-allyl-3-methoxy methyl hydantoin thus obtained, 1.87 g of Karstedt's cat (available from Sigma-Aldrich Co. LLC), and 180.65 g of toluene were fed in and heated to 60° C. Into that, 40.28 g of triethoxy silane (available from Tokyo Chemical Industry Co., Ltd.) was dropped. After that, reaction was carried out for 2 hours, and the mixture was concentrated. By performing distillation after the concentration, 40.00 g of MOMHDITEOS targeted was obtained with a yield of 64.7%.

1H NMR (500 MHz, CDCl$_3$) was measured to find 54.90 (s, 2H), 3.91 (s, 2H), 3.81 (q, 6H), 3.41 (m, 5H), 1.69 (tt, 2H), 1.23 (t, 9H), 0.59 (t, 2H).

[2] Synthesis of Polymer (Hydrolysis Condensate)

Synthesis Example 1

20.2 g of tetraethoxy silane, 4.9 g of methyl triethoxy silane, 4.8 g of 3-(methoxy methyl)-1-(3-(triethoxy silyl) propyl) imidazolidine-2,4-dione, and 45.0 g of acetone were fed into a flask of 300 mL and stirred, and the mixture solution thus obtained was continuously stirred with a magnetic stirrer, and 25.0 g of aqueous nitric acid solution of 0.01 mol/L was dropped therein.

After the dropping, the flask was transferred to an oil bath adjusted to 85° C., and reflux was carried out for 240 min. After that, 60 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C.

The polymer thus obtained corresponds to Formula (E1), and a weight average molecular weight thereof was Mw 2,000 as determined by GPC in terms of polystyrene.

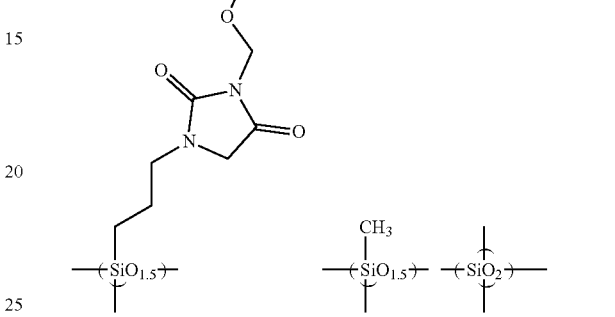

(E1)

Synthesis Example 2

18.1 g of tetraethoxy silane, 13.0 g of 3-(methoxy methyl)-1-(3-(triethoxy silyl)propyl) imidazolidine-2,4-dione, and 46.6 g of acetone were fed into a flask of 300 mL and stirred, and the mixture solution thus obtained was continuously stirred with a magnetic stirrer, and 22.4 g of aqueous nitric acid solution of 0.01 mol/L was dropped therein.

After the dropping, the flask was transferred to an oil bath adjusted to 85° C., and reflux was carried out for 240 min. After that, 60 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C.

The polymer thus obtained corresponds to Formula (E2), and a weight average molecular weight thereof was Mw 1,800 as determined by GPC in terms of polystyrene.

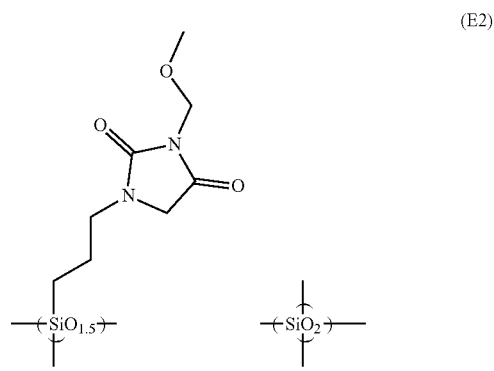

(E2)

Synthesis Example 3

21.9 g of tetraethoxy silane, 5.1 g of methyl triethoxy silane, 5.2 g of 3-(methoxy methyl)-1-(3-(triethoxy silyl)propyl) imidazolidine-2,4-dione, and 48.7 g of acetone were fed into a flask of 300 mL and stirred, and the mixture solution thus obtained was continuously stirred with a magnetic stirrer, and a mixture solution of 18.8 g of aqueous nitric acid solution of 0.2 mol/L and 0.31 g of dimethylaminopropyltrimethoxysilane was dropped therein.

After the dropping, the flask was transferred to an oil bath adjusted to 85° C., and reflux was carried out for 240 min. After that, 64 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C. The polymer thus obtained corresponds to Formula (E3), and a weight average molecular weight thereof was Mw 2,500 as determined by GPC in terms of polystyrene.

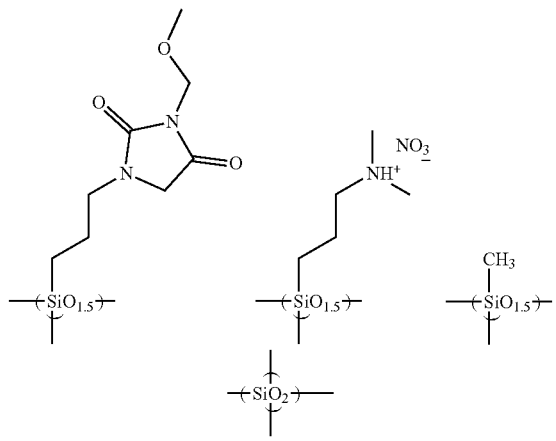

(E3)

Synthesis Example 4

19.5 g of tetraethoxy silane, 2.4 g of methyl triethoxy silane, 4.7 g of 3-(methoxy methyl)-1-(3-(triethoxy silyl)propyl) imidazolidine-2,4-dione, 3.8 g of 4-ethoxyethoxyphenyl trimethoxy silane, and 45.5 g of acetone were fed into a flask of 300 mL and stirred, and the mixture solution thus obtained was continuously stirred with a magnetic stirrer, and 24.1 g of aqueous nitric acid solution of 0.01 mol/L was dropped therein.

After the dropping, the flask was transferred to an oil bath adjusted to 85° C., and reflux was carried out for 240 min. After that, 60 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C.

The polymer thus obtained corresponds to Formula (E4), and a weight average molecular weight thereof was Mw 2,600 as determined by GPC in terms of polystyrene.

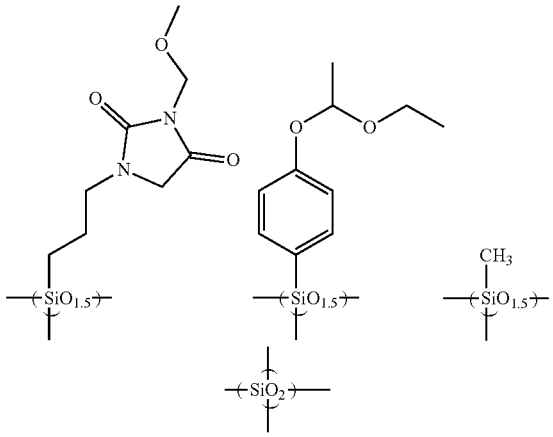

(E4)

Synthesis Example 5

19.8 g of tetraethoxy silane, 2.4 g of methyl triethoxy silane, 4.7 g of 3-(methoxy methyl)-1-(3-(triethoxy silyl)propyl) imidazolidine-2,4-dione, 3.2 g of glycidoxy propyl trimethoxy silane, and 45.3 g of acetone were fed into a flask of 300 mL and stirred, and the mixture solution thus obtained was continuously stirred with a magnetic stirrer, and 24.5 g of aqueous nitric acid solution of 0.01 mol/L was dropped therein.

After the dropping, the flask was transferred to an oil bath adjusted to 85° C., and reflux was carried out for 240 min. After that, 60 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C.

The polymer thus obtained corresponds to Formula (E5), and a weight average molecular weight thereof was Mw 2,800 as determined by GPC in terms of polystyrene.

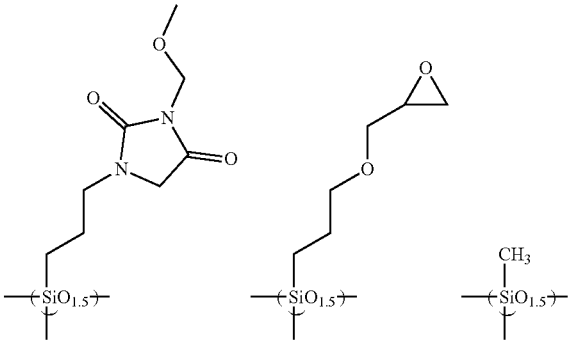

(E5)

Synthesis Example 6

19.7 g of tetraethoxy silane, 4.8 g of methyl triethoxy silane, 5.7 g of 1,3-bis(methoxy methyl)-5-(3-(triethoxy silyl)propyl)-1,3,5-triazine-2,4,6-trione, and 45.3 g of acetone were fed into a flask of 300 mL and stirred, and the mixture solution thus obtained was continuously stirred with a magnetic stirrer, and 24.4 g of aqueous nitric acid solution of 0.01 mol/L was dropped therein.

After the dropping, the flask was transferred to an oil bath adjusted to 85° C., and reflux was carried out for 240 min. After that, 60 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C.

The polymer thus obtained corresponds to Formula (E6), and a weight average molecular weight thereof was Mw 2,200 as determined by GPC in terms of polystyrene.

It should be noted that 1,3-bis(methoxy methyl)-5-(3-(triethoxy silyl)propyl)-1,3,5-triazine-2,4,6-trione was synthesized according to a method described in WO2019/003767 (and so forth).

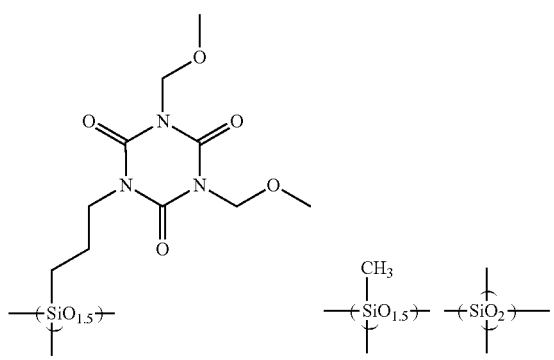

(E6)

Synthesis Example 7

16.9 g of tetraethoxy silane, 14.7 g of 1,3-bis(methoxy methyl)-5-(3-(triethoxy silyl)propyl)-1,3,5-triazine-2,4,6-trione, and 47.4 g of acetone were fed into a flask of 300 mL and stirred, and the mixture solution thus obtained was continuously stirred with a magnetic stirrer, and 20.9 g of aqueous nitric acid solution of 0.01 mol/L was dropped therein.

After the dropping, the flask was transferred to an oil bath adjusted to 85° C., and reflux was carried out for 240 min. After that, 60 g of propylene glycol monoethyl ether was added therein, and acetone, methanol, ethanol, and water were distilled off under reduced pressure, and concentration was performed, thereby obtaining a hydrolysis condensate (polymer) solution. Propylene glycol monoethyl ether was further added to the solution so as to achieve a solvent proportion of propylene glycol monoethyl ether of 100% and a solid residue content of 13% by weight at 140° C.

The polymer thus obtained corresponds to Formula (E7), and a weight average molecular weight thereof was Mw 2,000 as determined by GPC in terms of polystyrene.

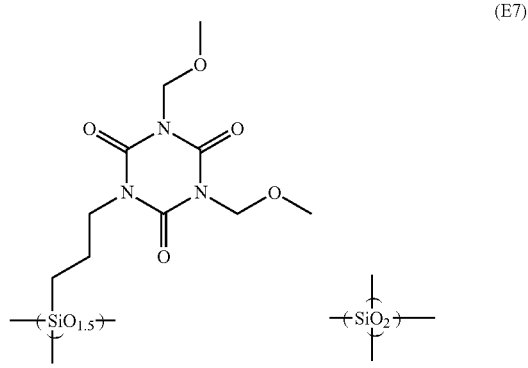

(E7)

Comparative Synthesis Example 1

24.1 g of tetraethoxy silane, 1.8 g of phenyl trimethoxy silane, 9.5 g of triethoxy methyl silane, and 53.0 g of acetone were fed into a flask of 300 mL and stirred, and the mixture solution thus obtained was continuously stirred with a magnetic stirrer, and 11.7 g of aqueous hydrochloric acid solution of 0.01 mol/L was dropped therein.

After the dropping, the flask was transferred to an oil bath adjusted to 85° C., and reflux was carried out for 240 min. After that, 70 g of propylene glycol monomethyl ether was added therein, and acetone, methanol, ethanol, and water were distilled off under reduced pressure, and concentration was performed, thereby obtaining a hydrolysis condensate (polymer) solution. Propylene glycol monomethyl ether was further added to the solution so as to achieve a solid residue content of 13% by weight at 140° C. The polymer thus obtained corresponds to Formula (C1), and a weight average molecular weight thereof was Mw 1,400 as determined by GPC in terms of polystyrene.

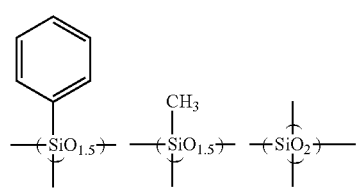

(C1)

[3] Preparation of Composition to be Applied on Resist Pattern

The polysiloxanes (polymers) obtained in Synthesis Examples and Comparative Synthesis Example, acids, and solvents were mixed in proportions shown in Table 1, and the mixtures thus obtained were filtered with a filter of fluorine-based resin of 0.1 μm, thereby preparing compositions to be applied on a resist pattern.

Note that the proportions of addition of the polymers in Table 1 are not amounts of the solution of the polymers added, but the amounts of the polymers per se. Moreover, DIW stands for ultrapure water, PGEE stands for propylene glycol monoethyl ether, PGMEA stands for propylene glycol monomethyl ether acetate, PGME stands for propylene glycol monomethyl ether, MA stands for maleic acid, TPSNO3 stands for triphenyl sulfonium nitrate, TPSML stands for triphenyl sulfonium maleate, TPSTFA stands for triphenyl sulfonium trifluoro acetate, TPSC1 stands for triphenyl sulfonium hydrochloride, and TPSAc stands for triphenyl sulfonium acetate, respectively.

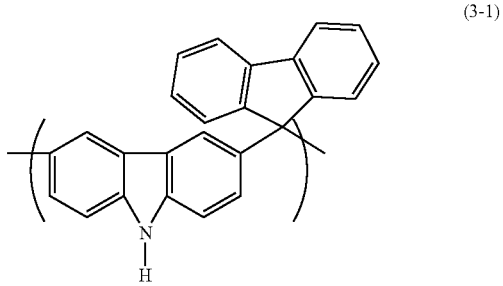

(3-1)

TABLE 1

| | Polymer | Additive 1 | Additive 2 | Solvent | | | |
|---|---|---|---|---|---|---|---|
| | | | | PGEE | PGMEA | PGME | DIW |
| Example 1 | Synthesis Example 1 | MA | TPSNO3 | PGEE | PGMEA | PGME | DIW |
| (parts by mass) | 1 | 0.03 | 0.05 | 70 | 10 | 8 | 12 |
| Example 2 | Synthesis Example 2 | MA | TPSML | PGEE | PGMEA | PGME | DIW |
| (parts by mass) | 1 | 0.03 | 0.05 | 70 | 10 | 8 | 12 |
| Example 3 | Synthesis Example 3 | MA | — | PGEE | PGMEA | PGME | DIW |
| (parts by mass) | 1 | 0.03 | — | 70 | 10 | 8 | 12 |
| Example 4 | Synthesis Example 4 | MA | TPSTFA | PGEE | PGMEA | PGME | DIW |
| (parts by mass) | 1 | 0.03 | 0.05 | 70 | 10 | 8 | 12 |
| Example 5 | Synthesis Example 5 | MA | TPSCl | PGEE | PGMEA | PGME | DIW |
| (parts by mass) | 1 | 0.03 | 0.15 | 70 | 10 | 8 | 12 |
| Example 6 | Synthesis Example 6 | MA | TPSAc | PGEE | PGMEA | PGME | DIW |
| (parts by mass) | 1 | 0.03 | 0.05 | 70 | 10 | 8 | 12 |
| Example 7 | Synthesis Example 7 | MA | TPSNO3 | PGEE | PGMEA | PGME | DIW |
| (parts by mass) | 1 | 0.03 | 0.05 | 70 | 10 | 8 | 12 |
| Comparative Example 1 | Comparative Synthesis Example 1 | MA | — | PGEE | PGMEA | PGME | DIW |
| (parts by mass) | 1 | 0.03 | — | 70 | 10 | 8 | 12 |
| Comparative Example 2 | Comparative Synthesis Example 1 | MA | TPSNO3 | PGEE | PGMEA | PGME | DIW |
| (parts by mass) | 1 | 0.03 | 0.05 | 70 | 10 | 8 | 12 |

[4] Preparation of Organic Resist Underlayer Film-Forming Composition

Under nitrogen environment, carbazole (6.69 g, 0.040 mol, available from Tokyo Chemical Industry Co., Ltd.), 9-fluorenone (7.28 g, 0.040 mol, available from Tokyo Chemical Industry Co., Ltd.), p-toluene sulfonic acid monohydrate (0.76 g, 0.0040 mol, available from Tokyo Chemical Industry Co., Ltd.) were fed into a 4-neck flask of 100 mL, and after that, 1,4-dioxane (6.69 g, available from Kanto Chemical Co., Inc.) was added therein, and the mixture thus obtained was stirred and heated to 100° C. so as to dissolve solids and start polymerization. After 24 hours, a reaction mixture was let stand to cool down to 60° C.

Into the reaction mixture thus cooled, chloroform (34 g, available from Kanto Chemical Co., Inc.) was added to dilute the reaction mixture, and the mixture thus diluted was dropped into methanol (168 g, available from Kanto Chemical Co., Inc.).

Precipitates thus obtained was filtered out, and residues of the filtration was dried at 80° C. for 24 hours, thereby obtaining 9.37 g of a targeted polymer represented by Formula (3-1) (hereinafter, abbreviated as PCzFL).

Note that $^1$H-NMR measurement results of PCzFL were as below.

$^1$H-NMR (400 MHz, DMSO-$d_6$): δ7.03-7.55 (br, 12H), δ7.61-8.10 (br, 4H), δ11.18 (br, 1H)

Moreover, a weight average molecular weight of PCzFL was Mw 2,800 (Mw/Mn 1.77) as determined by GPC in terms of polystyrene.

20 g of PCzFL, 3.0 g of tetramethoxy methyl glycoluril (available from Nihon Cytec Industries Inc. (previously, Mitsui Cytec Ltd.), product name: Powder Link 1174) as a crosslinking agent, 0.30 g of pyridinium p-toluene sulfonate as a catalyst, and 0.06 g of MEGAFAC R-30 (available from DIC Corporation, product name) as a surfactant were mixed together, and the mixture thus obtained was dissolved in 88 g of propylene glycol monomethyl ether acetate. The solution thus obtained was filtered with a polyethylene-made microfilter with a pore size of 0.10 μm, and further filtered with a polyethylene-made microfilter with a pore size of 0.05 μm, thereby obtaining an organic resist underlayer film-forming composition for use in a lithography process performed with a multilayer film.

[5] Solvent Tolerance and Developer Solubility Tests

The compositions obtained in Examples 1 to 7 and Comparative Examples 1 and 2 were each applied on silicon wafers by using a spinner, and heated on a hot plate at 215° C. for 1 min, thereby forming Si-containing resist underlayer films (film thickness 20 nm).

After that, on each of the Si-containing resist underlayer films, a mixture solvent of propylene glycol monomethyl ether/propylene glycol monomethyl ether acetate (7/3 (V/V)) was applied and spin-dried. Based on a film thickness before the application that had been evaluated as to whether or not the film thickness after the application changed, the film thickness changes after the application of less than 1% was evaluated as "Good," while the film thickness changes after the application of 1% or more was evaluated as "Poor."

Moreover, on each of Si-containing resist underlayer films formed in the same manner, an alkali developer (TMAH 2.38% aqueous solution) was applied and spin-dried, and whether or not the film thickness after the application changed was evaluated. Based on the film thickness before the application, the film thickness changes after the application of less than 1% was evaluated as "Good," while the film thickness changes after the application of 1% or more was evaluated as "Poor."

TABLE 2

|  | Solvent Tolerance | Developer Solubility |
|---|---|---|
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Comparative Example 1 | Poor | Poor |
| Comparative Example 2 | Good | Good |

[6] Measurement of Dry Etching Rate

In measurement of a dry etching rate, the following etchers and etching gases were used.

Lam 2300 (available from Lam Research Corporation): $CF_4/CHF_3/N_2$ (fluorine-based gas)

RIE-10NR (available from SAMCO Inc.): $O_2$ (oxygen-based gas) The compositions thus obtained in Examples 1 to 7 and Comparative Example 2 were each applied on silicon wafers by using a spinner, and heated on a hot plate at 215° C. for 1 min, thereby forming Si-containing coating films (film thickness 20 nm).

Using silicon wafers with the respective Si-containing coating films thus obtained, dry etching rates were measured with $CF_4/CHF_3/N_2$ gas and $O_2$ gas as an etching gas.

Note that the drying etching rates using the $O_2$ gas are expressed as ratios with respect to a drying etching rate of an organic resist underlayer film with the 02 gas. The organic resist underlayer film was prepared in the following method. An organic resist underlayer film-forming composition was applied on a silicon wafer with a spinner, and heated on a hot plate at 215° C. for 1 min, thereby forming an organic resist underlayer film (film thickness 20 nm).

TABLE 3

|  | Fluorine-based gas etching rate (nm/min) | Oxygen-based gas tolerance (against organic resist underlayer film) |
|---|---|---|
| Example 1 | 40 | 0.02 |
| Example 2 | 45 | 0.03 |
| Example 3 | 42 | 0.02 |
| Example 4 | 38 | 0.03 |
| Example 5 | 41 | 0.03 |
| Example 6 | 42 | 0.03 |
| Example 7 | 48 | 0.05 |
| Comparative Example 2 | 30 | 0.02 |

[7] Formation of Resist Pattern with EUV Exposure: Positive-Type Alkali Development The organic resist underlayer film-forming composition was applied on a silicon wafer with a spinner, and heated on a hot plate at 215° C. for 1 min, thereby forming an organic resist underlayer film with a film thickness of 90 nm.

On the organic resist underlayer film, the resist underlayer film-forming composition thus obtained in Example 1 was spin-coated and heated on a hot plate at 215° C. for 1 min, thereby forming a resist underlayer film layer (B) (20 nm).

Further on the resist underlayer film layer (B), an EUV resist solution (methacrylate resin-type, polyhydroxy styrene resin-type hybrid resist) was spin-coated, and heated on a hot plate at 130° C. for 1 min, forming an EUV resist layer (C). This was exposed with an EUV light exposure device (NXE 3300 B) (available from ASML Holding N.V.) under conditions of NA=0.33, σ=0.67/0.90, Dipole.

After the light exposure, post-exposure heating (110° C., 1 min) was carried out, and this was cooled down on a cooling plate to a room temperature, and developed for 60 seconds using an alkali developer (2.38% TMAH aqueous solution), and subjected to rinsing treatment, thereby forming a resist pattern.

In similar manners, resist patterns were formed using the resist underlayer film-forming compositions in Examples 2 to 7 and Comparative Example 2.

In addition, each of the patterns thus obtained was evaluated as to whether or not 16 nm of line-and-space with 32 nm pitches was formed by observing pattern shapes by pattern cross-section observation.

In Table 4, "Good" indicates a state where the shapes were between footing and undercutting and where no significant residues were in space portions. "Collapsed" indicates an unfavorable state that the resist patterns were peeled off and collapsed. In addition, "Bridge" indicates an unfavorable state that upper portions or lower portions of the resist patterns were in contact with one another.

TABLE 4

|  | Pattern shape |
|---|---|
| Example 1 | Good |
| Example 2 | Good |
| Example 3 | Good |
| Example 4 | Good |
| Example 5 | Good |
| Example 6 | Good |
| Example 7 | Good |
| Comparative Example 2 | Collapsed |

The invention claimed is:

1. A film-forming composition, comprising at least one kind selected from a hydrolyzable silane, a hydrolysis product thereof, and a hydrolysis condensate thereof, and a solvent, the hydrolyzable silane including a crosslinkable group-containing silane represented by Formula (1):

$$R^1R^2_aSi(R^3)_{3-a} \qquad (1)$$

wherein in Formula (1), $R^1$ is a group bonding to a silicon atom, and independently represents an organic group containing an amide group or an amino group having an alkoxy alkyl group on a nitrogen atom thereof, $R^2$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, R³ is a group or an atom bonding to a silicon atom, and independently represents an alkoxy group, an aralkyloxy group, an acyloxy group, or a halogen atom, and a is an integer of 0 to 2.

2. A film-forming composition, comprising at least one kind selected from a hydrolyzable silane, a hydrolysis product thereof, and a hydrolysis condensate thereof, and a solvent,
the hydrolyzable silane including a crosslinkable group-containing silane represented by Formula (1):

$$R^1R^2_aSi(R^3)_{3-a} \quad (1)$$

wherein, in Formula (1), R¹ is a group bonding to a silicon atom, and independently represents an organic group containing an amide group or an amino group having a hydroxy alkyl group or an alkoxy alkyl group on a nitrogen atom thereof, R² is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, R³ is a group or an atom bonding to a silicon atom, and independently represents an alkoxy group, an aralkyloxy group, an acyloxy group, or a halogen atom, and a is an integer of 0 to 2, and wherein the organic group containing the amide group or the amino group having the hydroxy alkyl group or the alkoxy alkyl group on the nitrogen atom thereof is a group represented by any one of the following Formulae (A1) and (A3) to (A10):

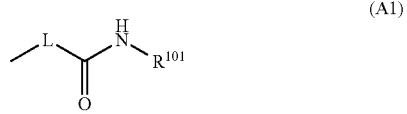
(A1)

(A3)

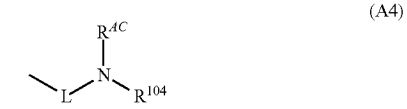
(A4)

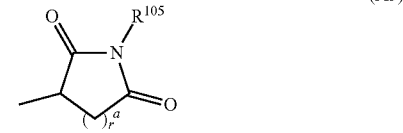
(A5)

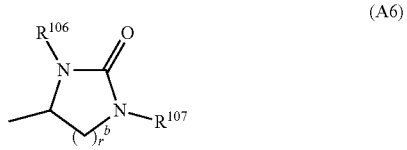
(A6)

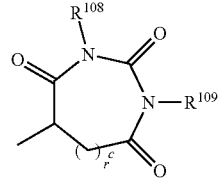
(A7)

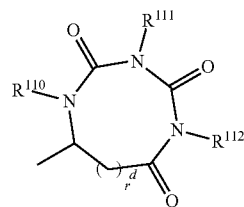
(A8)

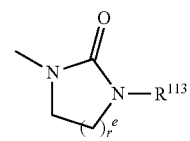
(A9)

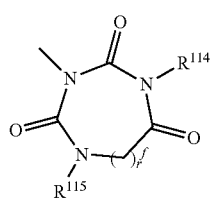
(A10)

wherein, in Formulae (A1) and (A3) to (A10),
each of $R^{101}$ and $R^{103}$ to $R^{115}$ independently represents a hydroxy alkyl group or an alkoxy alkyl group,
each of L independently represents an alkylene group,
each of $R^{AC}$ independently represents an alkyl carbonyl group, and
each of $r^a$ to $r^f$ is independently an integer of 0 to 4.

3. The film-forming composition according to claim 1, comprising the hydrolysis condensate of the hydrolyzable silane.

4. The film-forming composition according to claim 1, wherein the hydrolyzable silane includes the crosslinkable group-containing silane represented by Formula (1), and at least one kind selected from another silane represented by Formula (2) and another silane represented by Formula (3):

$$R^{11}_bSi(R^{12})_{4-b} \quad (2)$$

$$[R^{21}_cSi(R^{22})_{3-c}]_2Y \quad (3)$$

wherein in Formula (2), R¹¹ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^{12}$ is a group or an atom bonding to a silicon atom, and independently represents an alkoxy group, an aralkyloxy group, an acyloxy group, or a halogen atom, b represents an integer of 0 to 3, and wherein in Formula (3), $R^{21}$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^{22}$ is a group or an atom bonding to a silicon atom, and independently represents an alkoxy group, an aralkyloxy group, an acyloxy group or a halogen atom, Y is a group bonding to a silicon atom, and independently represents an alkylene group or an arylene group, and c is independently an integer of 0 to 2.

5. The film-forming composition according to claim 4, wherein the hydrolyzable silane includes the crosslinkable group-containing silane represented by Formula (1) and the other silane represented by Formula (2).

6. The film-forming composition according to claim 1, wherein the hydrolyzable silane further includes a hydrolyzable organosilane having an onium group in its molecule.

7. The film-forming composition according to claim 1, wherein the solvent includes water.

8. The film-forming composition according to claim 1, further comprising a pH adjuster.

9. The film-forming composition according to claim 1, being used for forming a resist underlayer film for use in a lithographic process.

10. A resist underlayer film obtainable from the film-forming composition according to claim 1.

11. A substrate for semiconductor processing, comprising: a semiconductor substrate; and the resist underlayer film according to claim 10.

12. A method for producing a semiconductor device, the producing method comprising:
- a step of forming, on a semiconductor substrate, a resist underlayer film from the film-forming composition according to claim 1;
- a step of forming a resist film on the resist underlayer film;
- a step of performing light exposure of the resist film;
- a step of developing the resist film after the light exposure, and obtaining a resist pattern;
- a step of etching the resist underlayer film with the resist pattern; and
- a step of processing the semiconductor substrate with the patterned resist film and resist underlayer film.

13. A method for producing a semiconductor device, the producing method comprising:
- a step of forming an organic underlayer film on a semiconductor substrate;
- a step of forming, on the organic underlayer film, a resist underlayer film from the film-forming composition according to claim 1;
- a step of forming a resist film on the resist underlayer film;
- a step of performing light exposure of the resist film;
- a step of developing the resist film after the light exposure, and obtaining a resist pattern;
- a step of etching the resist underlayer film with the resist pattern; and
- a step of processing the semiconductor substrate with the patterned resist film and resist underlayer film.

14. A crosslinkable group-containing silane, represented by Formula (1):

$$R^1 R^2_a Si(R^3)_{3-a} \quad (1)$$

wherein, in Formula (1), $R^1$ is a group bonding to a silicon atom, and independently represents a group represented by any one of the following Formulae (A1) and (A3) to (A10):

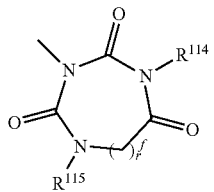
(A10)

wherein, in Formulae (A1) and (A3) to (A10),
each of $R^{101}$ and $R^{103}$ to $R^{115}$ independently represents a hydroxy alkyl group or an alkoxy alkyl group,
each of L independently represents an alkylene group,
each of $R^{AC}$ independently represents an alkyl carbonyl group, and
each of $r^a$ to $r^f$ is independently an integer of 0 to 4, $R^2$ is a group bonding to a silicon atom, and independently represents an alkyl group that may be substituted, an aryl group that may be substituted, an aralkyl group that may be substituted, a halogenated alkyl group that may be substituted, a halogenated aryl group that may be substituted, a halogenated aralkyl group that may be substituted, an alkoxy alkyl group that may be substituted, an alkoxy aryl group that may be substituted, an alkoxy aralkyl group that may be substituted, or an alkenyl group that may be substituted, or represents an organic group containing an epoxy group, an acryloyl group, a methacryloyl group, a mercapto group, an amino group, or a cyano group, $R^3$ is a group or an atom bonding to a silicon atom, and independently represents an alkoxy group, an aralkyloxy group, an acyloxy group, or a halogen atom, and a is an integer of 0 to 2.

* * * * *